(12) United States Patent
Damadian et al.

(10) Patent No.: US 7,123,008 B1
(45) Date of Patent: Oct. 17, 2006

(54) POSITIONAL MAGNETIC RESONANCE IMAGING

(75) Inventors: Raymond V. Damadian, Woodbury, NY (US); Robert Wolf, Medford, NJ (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 10/419,385

(22) Filed: Apr. 21, 2003

Related U.S. Application Data

(60) Provisional application No. 60/373,789, filed on Apr. 19, 2002.

(51) Int. Cl.
*G01V 3/00* (2006.01)

(52) U.S. Cl. ................................................ 324/309

(58) Field of Classification Search ........ 324/300–322; 600/410
See application file for complete search history.

(56) References Cited

U.S. PATENT DOCUMENTS

| | | |
|---|---|---|
| 3,789,832 A | 2/1974 | Damadian |
| 4,350,998 A | 9/1982 | Verhoeven |
| 4,394,684 A | 7/1983 | Verhoeven |
| 4,411,270 A | 10/1983 | Damadian |
| 4,534,076 A | 8/1985 | Barge |
| 4,534,358 A | 8/1985 | Young |
| 4,629,989 A | 12/1986 | Riehl et al. |
| 4,770,182 A | 9/1988 | Damadian et al. |
| 4,829,252 A | 5/1989 | Kaufman |
| 4,871,966 A | 10/1989 | Smith et al. |
| 4,875,485 A | 10/1989 | Matsutani |
| 4,908,844 A | 3/1990 | Hasegawa |
| 4,924,198 A | 5/1990 | Laskaris |
| 4,968,937 A | 11/1990 | Akgun |
| 4,985,678 A | 1/1991 | Gangarosa et al. |
| 5,008,624 A | 4/1991 | Yoshida |
| 5,065,761 A | 11/1991 | Pell |
| 5,153,546 A | 10/1992 | Laskaris |
| 5,162,768 A | 11/1992 | McDougall et al. |
| 5,197,474 A | 3/1993 | Englund et al. |
| 5,207,224 A | 5/1993 | Dickinson et al. |
| 5,273,040 A | 12/1993 | Apicella et al. |
| 5,289,374 A | 2/1994 | Doi et al. |
| 5,305,365 A | 4/1994 | Coe |
| 5,305,749 A | 4/1994 | Li et al. |
| 5,315,248 A | 5/1994 | Yamaguchi |
| 5,349,956 A | 9/1994 | Bonutti |

(Continued)

FOREIGN PATENT DOCUMENTS

JP H01-242056 9/1989

(Continued)

OTHER PUBLICATIONS

Damadian et al., U.S. Appl. No. 10/419,407, filed Apr. 21, 2003.

(Continued)

*Primary Examiner*—Diego Gutierrez
*Assistant Examiner*—Dixomara Vargas
(74) *Attorney, Agent, or Firm*—Lerner, David, Littenberg, Krumholz & Mentlik, LLP

(57) ABSTRACT

A patient is examined by magnetic resonance imaging in different positions relative to gravity by moving the patient relative to the magnet, and the acquired data is compared to show differences in anatomy due to differences in patient position. Individual data elements or groups of plural data elements representing particular locations in one set of image data can be compared with data elements associated with the same locations in another set of image data, to yield a set of comparison image data elements. The comparison data set can be used to detect difference caused by differences in position of the patient.

48 Claims, 9 Drawing Sheets

U.S. PATENT DOCUMENTS

| | | |
|---|---|---|
| 5,386,447 A | 1/1995 | Siczek |
| 5,436,607 A | 7/1995 | Chari et al. |
| 5,475,885 A | 12/1995 | Ishikawa |
| 5,515,863 A | 5/1996 | Damadian |
| 5,520,181 A | 5/1996 | Kreidler et al. |
| 5,592,090 A | 1/1997 | Pissanetzky |
| 5,606,970 A | 3/1997 | Damadian |
| 5,615,430 A * | 4/1997 | Nambu et al. ............... 5/600 |
| 5,624,159 A | 4/1997 | Celoni et al. |
| 5,640,958 A | 6/1997 | Bonutti |
| 5,647,360 A | 7/1997 | Bani-Hashemi et al. |
| 5,689,190 A * | 11/1997 | Cuppen ..................... 324/319 |
| 5,735,278 A | 4/1998 | Hoult et al. |
| 5,743,264 A | 4/1998 | Bonutti |
| 5,779,637 A | 7/1998 | Palkovich et al. |
| 5,810,727 A | 9/1998 | Groen |
| 5,873,824 A | 2/1999 | Doi et al. |
| 5,878,746 A | 3/1999 | Lemelson et al. |
| 5,969,525 A * | 10/1999 | Van Driel et al. ......... 324/318 |
| 5,983,424 A | 11/1999 | Naslund |
| 5,997,883 A | 12/1999 | Epstein et al. |
| 6,003,174 A | 12/1999 | Kantrowitz et al. |
| 6,009,341 A | 12/1999 | Edelman |
| 6,011,396 A | 1/2000 | Eckels et al. |
| 6,023,165 A | 2/2000 | Damadian et al. |
| 6,094,760 A | 8/2000 | Nonaka et al. |
| 6,097,977 A * | 8/2000 | Collick et al. ............. 600/410 |
| 6,112,112 A | 8/2000 | Gilhuijs et al. |
| 6,141,579 A | 10/2000 | Bonutti |
| 6,198,957 B1 | 3/2001 | Green |
| 6,246,239 B1 * | 6/2001 | Krogmann et al. ......... 324/318 |
| 6,249,695 B1 | 6/2001 | Damadian |
| 6,278,274 B1 * | 8/2001 | Biglieri et al. ............. 324/318 |
| 6,288,546 B1 * | 9/2001 | Damadian et al. .......... 324/319 |
| 6,335,623 B1 | 1/2002 | Damadian et al. |
| 6,414,486 B1 * | 7/2002 | Koellner et al. ............ 324/309 |
| 6,414,490 B1 * | 7/2002 | Damadian et al. .......... 324/319 |
| 6,509,735 B1 * | 1/2003 | Mueller et al. ............. 324/307 |
| 6,556,008 B1 * | 4/2003 | Thesen ....................... 324/307 |
| 6,559,641 B1 * | 5/2003 | Thesen ....................... 324/307 |
| 6,586,934 B1 * | 7/2003 | Biglieri et al. ............. 324/309 |
| 6,611,703 B1 * | 8/2003 | Kuth et al. ................. 600/415 |
| 6,667,618 B1 * | 12/2003 | Thesen ....................... 324/309 |
| 6,677,753 B1 * | 1/2004 | Danby et al. ............... 324/318 |
| 6,725,078 B1 * | 4/2004 | Bucholz et al. ............. 600/410 |
| 6,822,447 B1 * | 11/2004 | Yamagata ................... 324/318 |

FOREIGN PATENT DOCUMENTS

| | | |
|---|---|---|
| WO | WO-97/17896 | 5/1997 |

OTHER PUBLICATIONS

Damadian, U.S. Appl. No. 10/200,943, filed Jul. 23, 2002.
Danby et al., U.S. Appl. No. 09/718,946, filed Nov. 22, 2000.
Official Action, mailed Jun. 18, 2003, in U.S. Appl. No. 10/200,943.
Four (4) photographs of an exhibit at the Radiological Society for North America held in Dec. 1996.
Official Action mailed Mar. 7, 2005, in U.S. Appl. No. 10/756,576.

* cited by examiner

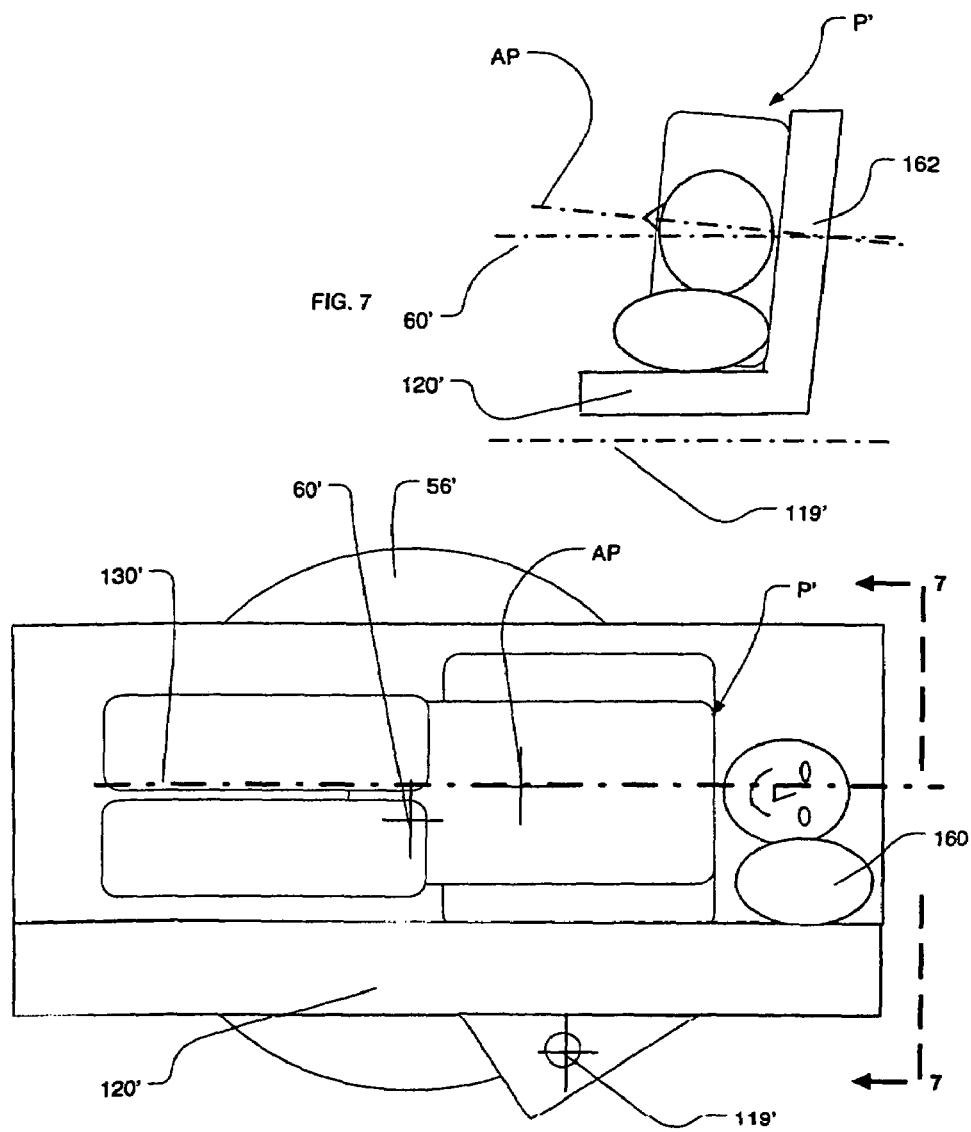

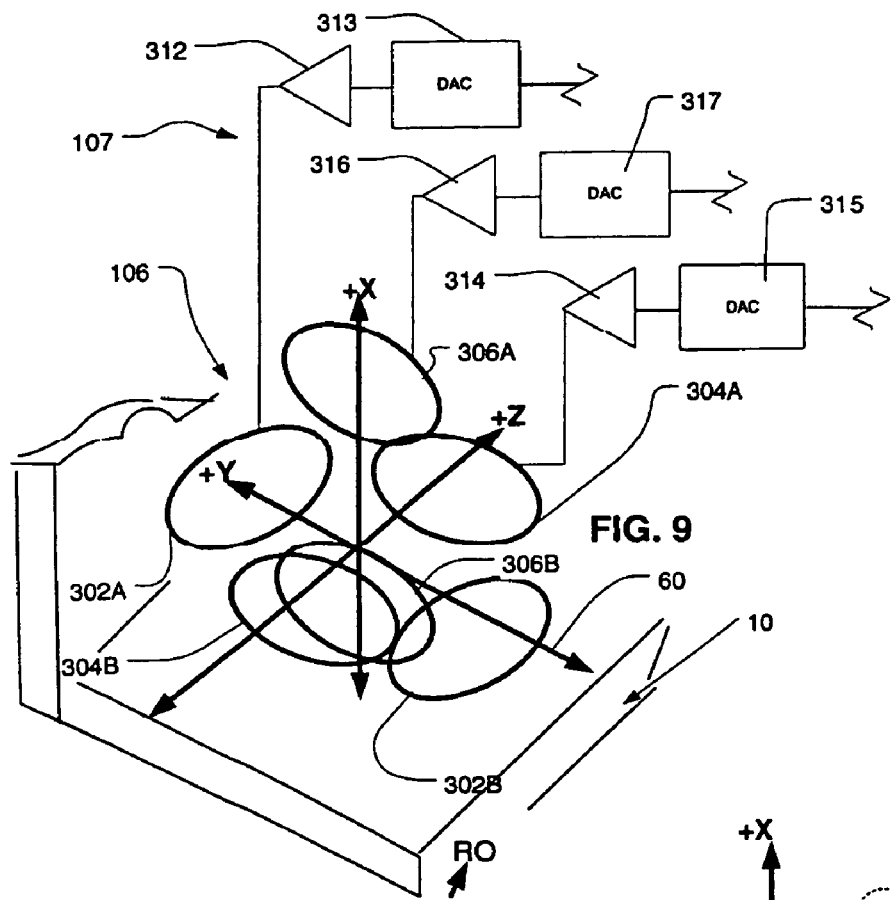
FIG. 9
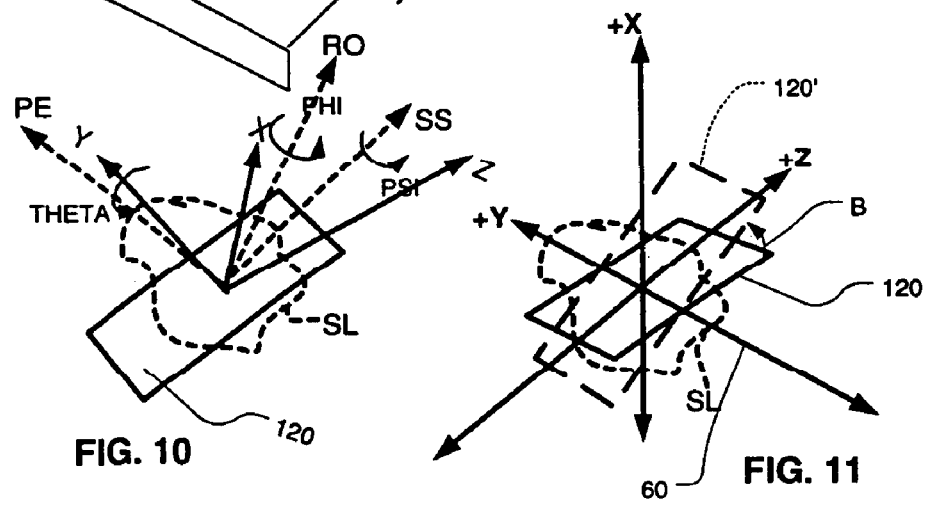
FIG. 10
FIG. 11

POSITIONAL MAGNETIC RESONANCE IMAGING

CROSS-REFERENCE TO RELATED APPLICATIONS

The present application claims benefit of U.S. Provisional Patent Application Ser. No. 60/373,789, filed Apr. 19, 2002, the entire disclosure of which is hereby incorporated by reference herein.

BACKGROUND OF THE INVENTION

The present invention relates to imaging techniques and apparatus for performing such techniques.

In magnetic resonance imaging ("MRI"), a strong, uniform magnetic field is applied to the region of the patient to be imaged. Radio frequency ("RF") energy is applied to this region of the patient by a transmitter and antenna. The RF energy excites atomic nuclei within the patient's tissues. The excited nuclei spin at a rate dependent upon the magnetic field. As they spin, they emit faint RF signals, referred to herein as magnetic resonance signals. By applying small magnetic field gradients so that the magnitude of the magnetic field varies with location within the patient's body, the magnetic resonance phenomenon can be limited to only a particular region or "slice" of the patient's body, so that all of the magnetic resonance signals come from that slice. Moreover, by applying additional magnetic field gradients, the frequency and phase of the magnetic resonance signals from different locations within the slice can be made to vary in a predictable manner depending upon the position within the slice. Stated another way, the magnetic resonance signals are "spatially encoded," so that it is possible to distinguish between signals from different parts of a slice.

If this process is repeated numerous times to elicit signals using different gradients, it is possible to derive a set of information which indicates one or more characteristics of magnetic resonance signals from particular locations within the patient's body. Such a set of information is referred herein to as an image data set. Because the characteristics of the magnetic resonance signals vary with the concentration of different chemical substances and other chemical characteristics of the tissues, different tissues provide different magnetic resonance signal characteristics. When a magnetic resonance signal image data set is displayed in a visual format, such as on a computer screen or printed image, the information forms a picture of the structures within the patient's body, with different tissues having different intensities or colors.

Typically, a magnetic resonance image data set is stored as a set of individual data elements. The data in each element represents one or more characteristics of magnetic resonance signals from a small volume element or "voxel." For example, the map can be stored as a three-dimensional array of data elements, the dimensions of the array corresponding to three-dimensional space. Data elements corresponding to a given plane in three-dimensional space can be selected for display in a two-dimensional picture such as a screen display or printed image. Each small area element on the surface of the picture, commonly referred to as a "pixel," is assigned an intensity or color value based on the numerical values of the data element for the corresponding voxel.

MRI has been widely adopted in the medical arts. Because MRI does not use X-rays or other ionizing radiation, it offers safety advantages over techniques such as conventional X-ray imaging, fluoroscopy and CAT imaging.

Moreover, MRI allows visualization of tissues which are difficult or impossible to depict using other techniques. Magnetic resonance imaging can show abnormal tissues in contrast to surrounding normal tissues. For example, as disclosed in U.S. Pat. No. 3,789,832 of Raymond V. Damadian, magnetic resonance signals from malignant tumors have a characteristic referred to as the spin-lattice relaxation time or "$T_1$" different from the $T_1$ of normal tissues. If a magnetic resonance image is taken so that the data in each data element depends at least in part on the $T_1$ of the tissue at the corresponding location, a picture showing malignant tumor tissue in contrast to normal tissue can be displayed.

MRI is also particularly useful in imaging the spine. MRI can depict the vertebrae in conjunction with related tissues such as the lamina or "discs," as well as nerves, muscles and other neighboring tissues.

In magnetic resonance angiography, the magnetic field gradients applied during imaging, and the characteristics of the magnetic resonance signals which are translated into the image, are selected according to principles well-known in the art so that the data in voxels within arteries differs from the data for voxels in other structures, so that the arteries can be depicted in contrasting color or density to surrounding tissues. For example, arterial blood has a significant velocity and the surrounding tissues are nearly stationary. A so-called "motion-sensitive" MRI technique can be used so that a characteristic of the magnetic resonance signals from each voxel depends on the velocity of matter within the voxel. Magnetic resonance angiography yields images directly analogous to those obtained by conventional angiography, without the need for X-ray exposure. In some cases, MRI angiography can be performed without injection of a contrast medium. Moreover, MRI angiography can provide three-dimensional imaging information, so that images from any desired perspective can be displayed.

However, magnetic resonance imaging procedures have suffered from significant limitations. Conventional MRI equipment requires that the patient lie in a supine position on a horizontal bed which fits with the patient receiving space of the static field magnet. Some medical conditions have effects which change with posture. For example, a spinal disc may impinge on a nerve or other surrounding structure only when the patient is in an upright posture so that the disk is compressed by the patient's weight. Various proposals have been advanced to allow MRI procedures to be performed on patients in a posture other than the conventional supplying of posture. For example, Japanese published Patent Application No. 1-242056 published Sep. 27, 1989 depicts a magnetic resonance imaging unit with a tilting bed for supporting the patient in a supine position or in a standing position. Yoshida, U.S. Pat. No. 5,008,624 depicts a magnetic resonance imaging instrument with movable static field magnet in conjunction with a patient carrier which supports the patient in "various postures." Palkovich et al., U.S. Pat. No. 5,779,637 discloses a system in which the patient lies supine within the static field magnet during one imaging procedure. The entire system, including the static field magnet and the patient can be pivoted so as to swing the magnet, the patient bed and the patient as a unit to a different position in which the patient bed extends vertically and the patient in an upright posture. A further image is taken in this position. None of these systems have been widely adopted.

Copending, commonly assigned U.S. patent application Ser. No. 09/718,946, filed Nov. 22, 2000 ("the '946 application"), the disclosure of which is hereby incorporated by reference herein, and copending commonly assigned U.S.

patent application Ser. No. 09/789,460 ("the '460 application"), now U.S. Pat. No. 6,414,490, the disclosure of which is also incorporated by reference herein describe additional MRI magnet structures and patient handling devices as well as additional imaging methods. As disclosed for example in certain embodiments of the '946 application, a patient support such as a bed which can both tilt and elevate can be used in conjunction with a static field magnet to allow imaging of a patient in various orientations and to position various portions of the patient's anatomy in the appropriate location relative to the magnet for imaging. Discussion of the '946 and '460 applications in this background section of the present application should not be taken as an admission that the same constitute legally available prior art with respect to the present invention.

Most commonly, pictures derived from MRI images are read by a physician visually examining the picture to diagnose disease which may be present or to evaluate the progress of a known disease. Such evaluation may involve, for example, a mental comparison by the physician with pictures the physician has previously seen of normal and other diseased patients or pictures taken in the past of the same patient. This task requires careful examination and considerable professional judgment. Even with the capabilities achievable in MRI imaging, it is not always easy to spot disease states or changes in the patient's condition. Lemelson et al., U.S. Pat. No. 5,878,746 proposes an automated process in which the computer examines a new image to extract "features relating to particular disease states" using a pattern recognition technique and stores signals descriptive of these features in a "fact database." These "feature signals" are compared with similar "feature signals" extracted from previously acquired images and the resulting comparison information is subjected to artificial intelligence rules to provide "a diagnostic assessment." Perhaps because of the extraordinary difficulty of developing appropriate automated tools for finding features relating to disease states and rules for deriving diagnostic assessments from the compared features, this approach has not been adopted widely, if at all, in practice. Thus, the physician still generally faces the task of visually observing a picture of a patient derived from a particular MRI imaging session and mentally comparing that picture with either a prior picture of the same patient or a mental image of a "normal" anatomy. In this process, the physician typically attempts to discern the outlines of body structures in the picture.

As disclosed in Apicella et al., U.S. Pat. No. 5,273,040, the volume of blood contained within the ventricles of the heart can be determined from an MRI image. To do this, the physician, or an automated system must accurately identify the boundary of the blood-containing ventricle. To enhance the accuracy of an automated process for detecting where the boundary lies, two MRI images taken through the patient's heart in rapid succession, as, for example, during successive heartbeats, are mathematically superimposed and subtracted from one another to yield a "difference image." Because the two MRI images are taken at two slightly different points in the cardiac cycle, the ventricles will be of slightly different sizes in the two images. Subtraction of the images will eliminate essentially all of the data, leaving only a small border or line having a width corresponding to the change in size between the first and second images. The difference image thus provides a clear line indicating the border of the ventricle which can be recognized in an automated system.

As disclosed in Bani-Hashemi et al., U.S. Pat. No. 5,647,360, digital subtraction angiography or "DSA" typically is performed using a computerized tomography or "CT" x-ray scan. A first set of CT scan data is obtained before injection of a contrast agent into the blood vessels, whereas a second scan is obtained a few minutes later, after injection of the contrast agent. The two data sets are registered with one another and subtracted from one another to yield a difference image which shows the blood vessels in high contrast. The registration procedure used to correlate data elements at corresponding locations within the patient in the two images with one another for subtraction operates by applying a mathematical transformation to one or another of the data sets. Different transformations are used for different parts of the transformed image so as to compensate for warping or non-uniform motion of different parts of the patient. The transformation for each portion of the image is determined using a pattern recognition procedure to match corresponding features shown in each portion of the image with corresponding features shown in the other image. The Bani-Hashemi patent suggests briefly that the registration technique "can be useful in various imaging systems, such as CT, MRI, PET, etc."

Despite all of the effort devoted in the art heretofore to development of imaging systems and techniques, still further enhancements would be desirable.

SUMMARY OF THE INVENTION

One aspect of the present invention provides a method of imaging a patient which, in its preferred embodiment, facilitates detection of changes in a body structure due to changes in patient orientation. A method according to this aspect of the invention includes the steps of imaging at least a part of a patient while such part of the patient is oriented in a first orientation relative to gravity so as to provide a first image data set and imaging at least such part of the patient while the party is oriented in a second orientation relative to gravity different from the first orientation so as to provide a second image data set. Most preferably, the imaging steps are performed by magnetic resonance imaging. The method according to this aspect of the invention most preferably also includes the step of comparing the first and second image data sets so as to provide a comparison image data set. The method most desirably further includes the step of displaying a visually perceptible image constructed in part from the comparison image data set. For example, the displaying step may include displaying a visually perceptible image constructed from the first data set, the second data set or both with highlighting of portions of such a visually perceptible image at regions of the image corresponding to locations where the comparison image data set indicates that differences exist between the first and second image data sets. Preferred procedures according to this aspect of the invention can greatly simplify the task of the physician in spotting changes in anatomy due to changes in orientation.

The patient part which is imaged may include a part of the torso. The imaging steps may be performed without displacing the patient part relative to other portions of the patient except as such displacement may be caused by gravity. For example, the patient may be disposed on a bed and the bed may be moved so that the bed is in a first orientation relative to gravity when the first data set is acquired and in a second, different orientation when the second data set is acquired.

Preferably, each of the first and second image data sets includes data elements each having coordinates. The data in each data element of each data set represents at least one characteristic of magnetic resonance signals from tissue at a physical location in a frame of reference associated with that data set, such physical location being specified by the coordinates. The method may further include the step of specifying a particular anatomical structure and the comparing step may include registering the first and second data sets with one another in a common frame of reference so that first data elements representing the specified anatomical structure in the first image data set have the same coordinates, in the common frame of reference, as second data elements representing the specified anatomical structure in the second data set. In this instance, the comparing step desirably includes comparing the data in one or more groups of first elements with the data in one or more groups of second elements having the same coordinates in the common frame of reference. Each group of data elements may include a single data element having data representing properties of magnetic resonance signals from a single volume element. For example, where each group includes a single data element, the data in a first data element may be subtracted from the data in a second data element having the same coordinates in the common frame of reference, or vice-versa. Other types of comparison, such as division or a determination as to equality or inequality between the data in these elements, may be used. In the alternative, each group of data elements may include a plurality of data elements having data representing properties of magnetic resonance signals from a plurality of contiguous volume elements or from a plurality of non-contiguous volume elements. Where each group of data elements includes a plurality of data elements, a composite property of the group, such as the sum or mean of the data in the various data elements in the group or a measure of variance among the data in the various data elements such as the standard deviation can be determined. In this case, the step of comparing the data in first and second groups of data elements may be performed by comparing the composite properties of these groups to one another.

As further discussed below, it is relatively simple to register the data sets at a particular, readily identifiable anatomical structure. If the data sets are registered at a particular anatomical structure, the comparison image set will accurately reflect meaningful anatomical changes in the vicinity of that anatomical structure as, for example, deformation of adjacent body structures caused by the change in orientation relative to gravity. One useful application of techniques in accordance with this aspect of the invention is in imaging of the spine. In this application, the first and second image data sets represent tissues including at least a part of the spine. The data sets may be registered at a particular vertebra so that the comparison image data set accurately indicates changes due to deformation of soft tissues in the vicinity of such vertebrae as the patient is reoriented relative to gravity. In imaging of cerebral structures, the pineal gland provides a readily-identifiable feature which can be used for registration of the data sets.

With regard to body structures remote from the specified body structure, the comparison image may reflect changes in position of a body structures due to distortion of intervening body structures under the influence of gravity. For example, if a lower lumbar vertebrae is the specified body structure, vertebrae of the neck may move between the first and second imaging steps due to compression of spinal lamina in the mid-back and the comparison image will reflect this movement. This can make it more difficult to spot differences caused by deformation in the neck. In a further enhancement, the method according to this aspect of the invention may further include the step of repeating the step of specifying an anatomical structure so to specify a new anatomical structure, and repeating the registering and comparing operations. For example, in the case of a spinal image, the physician may first specify a lumbar or sacral vertebra (in the lower back) and the registering and comparing steps may be performed so as to show meaningful anatomical changes in the vicinity of this vertebra. The physician may then specify a cervical vertebra (in the neck) and the registering and comparing steps are repeated so as to bring the data sets into registration at the neck vertebrae and show meaningful anatomical changes in the vicinity of that vertebrae. Similar approaches can be used in observation of soft tissues.

A method according to a further aspect of the invention includes the step of conducting magnetic resonance imaging on at least a part of the patient while such part is oriented in a first orientation relative to gravity and relative to physically stationary static field magnet of a magnet resonance imaging system so as to provide a first image data set. A method according to this aspect of the invention includes moving the part of the patient to a second orientation relative to gravity and relative to the static field magnet, the second orientation being different from the first orientation. Once again, the part of the patient is imaged while the part is in the second orientation so as to provide a second image data set and a difference data set representing a comparison between the first and second data sets is generated. In the methods according to this aspect of the invention, the patient moves but there is no need to move the static field magnet. As further discussed below, methods according to this aspect of the invention can be performed using practical apparatus.

A further aspect of the present invention provides a method of magnetic resonance imaging including the step of providing a static field magnet defining a patient-receiving space and horizontal field axis extending through the patient-receiving space. The magnet is arranged to provide a static magnetic field having a field direction parallel to this horizontal field axis. For example, the magnet may have a pair of opposed poles spaced apart from one another in a horizontal direction and the field axis may be a horizontal polar axis extending between these poles. In the alternative, the magnet may include a set of electromagnet coils such as superconducting coils spaced disposed on the horizontal field axis and arranged to generate a field along such axis. The method according to this aspect of the present invention includes disposing a patient in the patient-receiving space in a first disposition so that an anterior to posterior (front to back) axis of the patient is substantially horizontal and substantially parallel to the field axis. In this first disposition, the longitudinal (head to toe) axis of the patient points in a first direction. A method according to this aspect of the invention includes obtaining a first magnetic resonance image data set while the patient is in the first disposition, then rotating the patient around a pivot axis substantially parallel to the field axis and to the anterior to posterior axis of the patient to a second disposition in which the longitudinal axis of the patient points in a second direction different from the first direction. While the patient is in the second disposition a second magnetic resonance image data set is obtained. For example, the step of disposing the patient in the first disposition may include placing the patient on an elongated support such as a bed so that a side of the patient confronts the support, and the rotating step may include pivoting the support about the pivot axis. The longitudinal axis of the patient may extend generally vertically in one of the dispositions and generally horizontally in the other one of the dispositions. In methods according to this aspect of the invention, the patient is effectively tilted sideways between the first and second imaging step. Methods according to this aspect of the invention incorporate the realization that certain anatomical changes as for example lateral displacement of the spine or other organs can be observed more effectively with such a sideways tilt then with other forms of reorientation.

Yet another aspect of the invention provides magnetic resonance imaging apparatus including static field magnet with horizontal field axis and a pivotable patient bed as discussed above with reference to the method. In preferred apparatus according to this aspect of the invention, a patient engaging structure is mounted to the bed and is adapted to maintain a patient with the anterior to posterior axis of the patient substantially parallel to the field axis as, for example, with the side of the patient facing the bed, as the bed tilts about the pivot axis.

Yet another aspect of the invention provides magnetic resonance imaging apparatus including a static field magnet defining a patient receiving space and patient support adapted to hold a patient's body, the patient support being movable over a range of dispositions in which at least a part of the patients body supported on the patient support is disposed within the patient receiving space of the magnet. The patient support may be adapted to constrain at least those parts of the patient's body positioned within the patient receiving space against movement relative to on another. The apparatus according to this aspect of the invention most desirably includes a drive mechanism mechanically linked to the patient support and operative to move the patient support within the aforesaid range of positions. Additionally, the apparatus according to this aspect of the invention desirably includes a support controller operatively connected to the drive mechanism. The controller is arranged to actuate the drive mechanism so as to bring the patient support to a pre-selected sequence of positions within the range of positions. Most preferably, the apparatus includes gradient coils, a transmitter and a receiver, which themselves may be of the conventional types used in magnetic resonance imaging apparatus, as well as a system controller linked to the gradient coils, transmitter and receiver, the system controller being operative to actuate the gradient coils, transmitter and receiver to perform the sequence of operations required to elicit magnetic resonant signals from a patient in the patient receiving space, commonly referred to as a "pulse sequence." Most desirably, the support controller is operatively associated with the system controller so that magnetic resonance signals are elicited while the patient is in each of the pre-selected sequence of dispositions. The preferred apparatus according to this aspect of the invention can automatically move the patient and automatically acquire magnetic resonance data sets in a variety of patient positions. A related aspect of the present invention provides methods of magnetic resonance imaging including the steps of automatically moving the patient through a pre-selected sequence of dispositions relative to a static field magnet, most preferably without moving parts of the patient relative to one another. The moving step is performed so that in at least a plurality of the pre-selected dispositions the patient is subjected to a static field provided by the static field magnet. Magnetic resonance signals are elicited from the patient in the plurality of pre-selected dispositions.

These and other aspects, features and advantages of the present invention will be more readily apparent from the detailed description of the preferred embodiments set forth below, taken in conjunction with the accompanying drawings.

BRIEF DESCRIPTION OF THE DRAWINGS

FIG. 6 is a diagrammatic view depicting portions of apparatus according to a further embodiment of the invention.

FIG. 7 is a diagrammatic elevational view along line 7—7 in FIG. 6.

FIG. 9 is a schematic, partially perspective view depicting portions of the apparatus shown in FIG. 1.

FIGS. 10 and 11 are diagrammatic views depicting spatial relationships used in methods according to certain embodiments of the invention.

DETAILED DESCRIPTION OF THE PREFERRED EMBODIMENTS

Figure 1:
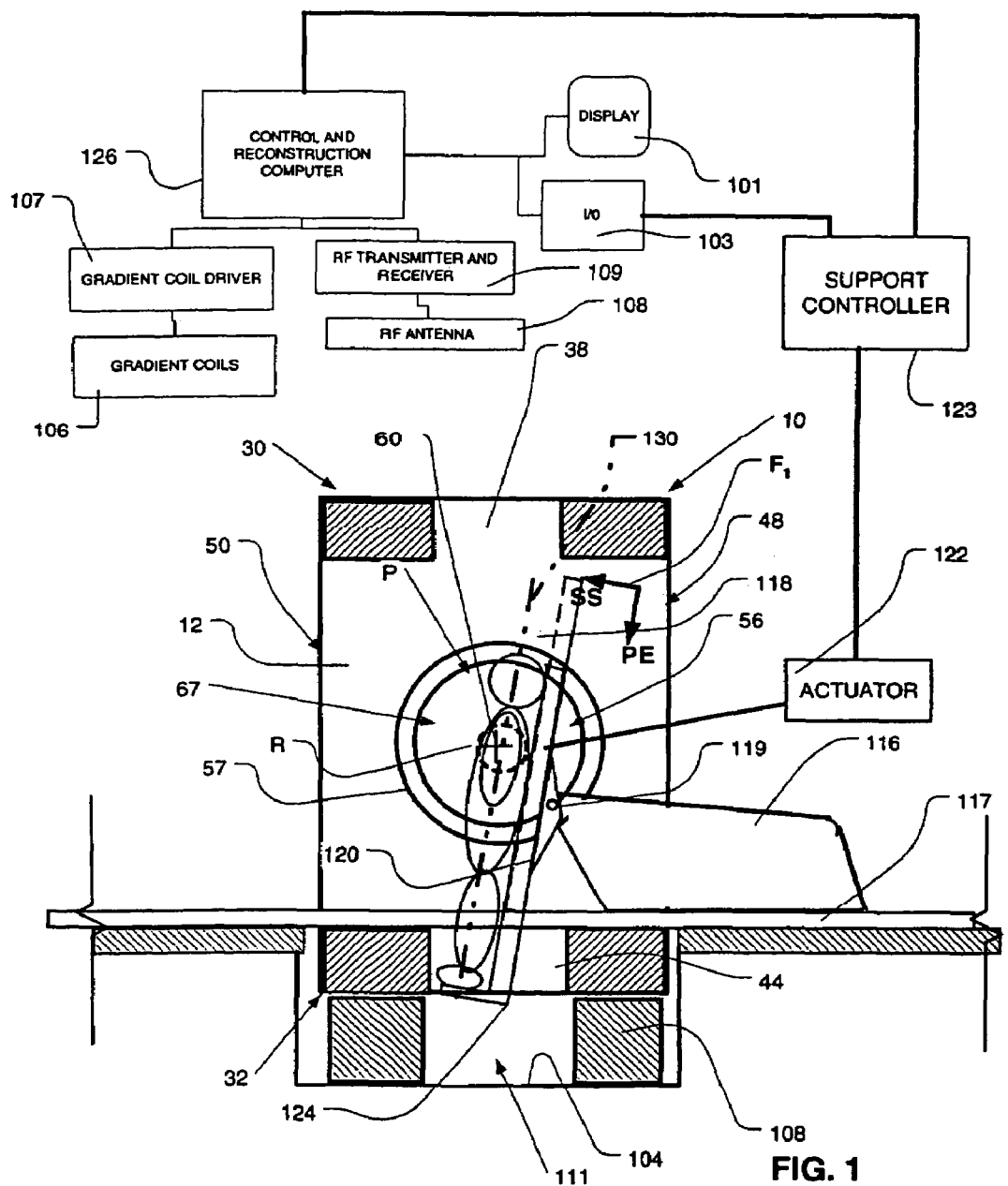
FIG. 1 is a diagrammatic sectional view of apparatus used in a method according to one embodiment of the invention during one step of the method.

Apparatus according to one embodiment of the present invention includes a ferromagnetic frame 10. As described in greater detail in the '946 application, the frame 10 is generally in the form of a hollow rectangular solid and includes a top flux return member 30 defining the top wall of the frame, a bottom flux return member 32 defining the bottom wall of the frame and a pair of generally vertical side walls 12 and 13 (FIG. 2) defining the sides of the frame, one such side wall 12 being visible in FIG. 1. The frame has large patient entry openings 48 and 50 (FIG. 1) at front and back sides of the frame, i.e., the vertical sides which are not occupied by side wall 12 and the opposite side wall. The top flux return member 30 defines opening 38 in the top wall of the frame, whereas the bottom flux return member 32 defines an opening 44 in the bottom wall. The frame-like structure is maintained above a base structure 104 so that there is a space 111 beneath the bottom of the flux return member communicating with opening 44.

Two cylindrical ferromagnetic poles 56, extend into the interior of the frame from side walls 12 and 13. The poles extend on a common horizontal polar axis 60 and define a patient receiving space 67 between them. The apparatus also includes a source of magnetic flux such as electromagnet coils 57 encircling the poles for providing a constant, substantially uniform static magnetic field within patient-receiving space 67.

A carriage 116 has a patient positioning assembly mounted thereon. The patient positioning assembly includes an elongated elevator frame pivotally mounted to the carriage for movement about a horizontal pivot axis 119. The patient positioning assembly further includes an elongated patient support or bed 120 with a footrest 124 at one end.

The patient support is slidably mounted on the carriage. An actuator assembly 122 is provided for driving the carriage along rails 117; for moving the patient support along the elevator frame 118 and for tilting the elevator frame about axis 119 relative to the carriage. Actuator assembly may include any devices which can be used to impel mechanical elements relative to one another in a controllable manner. For example, the actuator assembly can incorporate one or more motion sources such as rotary or linear electric motors, pneumatic or hydraulic motors, pneumatic or hydraulic cylinders and the like, and may also include mechanical linkages such as gears, belts, screws, racks, levers, chains, ropes and pulleys connecting each motion source between one or more pairs of elements. The actuator typically also includes control elements such as clutches, switches, valves and brakes responsive to externally-applied control signals. Additionally, the actuator assembly desirably includes feedback elements such as optical or electronic position encoders, switches or mechanical linkages. One set of feedback elements is linked to elevator frame 118 and patient support 120 for providing signals indicative of the position of the patient support relative to the elevator frame, whereas a further set of feedback elements is linked to elevator frame 118 and carriage 116 for providing signals indicative of the angular position of the elevator frame relative to the carriage. Yet another set of feedback elements provides an indication as to the position of carriage 116 on rails 117. The feedback elements can be directly linked to the elevator frame, patient support and carriage, or else can be indirectly connected to these elements through intermediate linkages as, for example, through linkages used to transmit motion from the motion source. The individual elements of the actuator assembly can be conventional elements as generally employed in automatic machinery. Those portions of the actuator assembly, carriage and patient support which extend within the patient-receiving space 67 during operation desirably are formed from non-magnetic materials and do not emit magnetic fields during operation. The carriage 116 is moveable on rails 117 extending into and out of magnetic frame through the patient entry openings 48 and 50.

A set of gradient coils 106 is physically mounted within the magnet frame. The gradient coils are arranged in the conventional manner to apply magnetic field gradients within the patient-receiving space. The gradient coils in turn are connected to a gradient coil driver 107 which is controlled by computer 126. In the conventional manner, the computer 126 can control the gradient coil driver to apply appropriate currents to the various gradient coils so as to provide gradients in the desired direction within patient-receiving space 67 and to vary these gradients with time.

A conventional RF antenna 108 and RF transmitting and receiving apparatus 109 are also associated with the control and reconstruction computer 126. The antenna may include one or more elements positioned in the conventional manner within the magnetic frame, on the patient support 120 or even carried by the patient. The transmitting and receiving apparatus can be actuated by the computer to apply RF excitation signals and to receive the magnetic resonance signals emitted by the patient. The apparatus may use the same or different antenna elements for transmitting and receiving.

The apparatus further includes a system controller, also referred to as a control and reconstruction computer 126, linked to a display 101 such as a CRT display or printer and input/output devices 103 for entry of data and control commands into the computer. The control and reconstruction computer includes the conventional elements of a general-purpose computer, including a programmable processor and conventional memory devices for storing data and programs. The input/output devices 103 may include conventional elements such as a keyboard, as well as a conventional pointing device such as a mouse, touchpad or trackball, and preferably also include specialized command entry devices such as switches or pushbuttons used to control at least some aspects of the patient movement as discussed below. As disclosed in commonly assigned U.S. patent application Ser. No. 10/301,187, filed Nov. 21, 2002 and entitled STAND-UP PATIENT HANDLING SYSTEM CONTROL KIOSK, and in the copending, commonly assigned U.S. Provisional Patent Application Ser. No. 60/373,964, filed Apr. 19, 2002 and entitled PATIENT HANDLING SYSTEM CONTROL KIOSK AND CONTROLLER, the disclosures of which are incorporated by reference herein, it is desirable to place at least some of the devices which control movement of the patient support on a panel close to the static field magnet but spaced from the magnet so that an operator positioned at the control panel can see into the magnet and observe the patient. For example, such a panel can include a "deadman switch," i.e., a button or other element which must be held continually by the operator to enable movement of the patient support.

Figure 2:
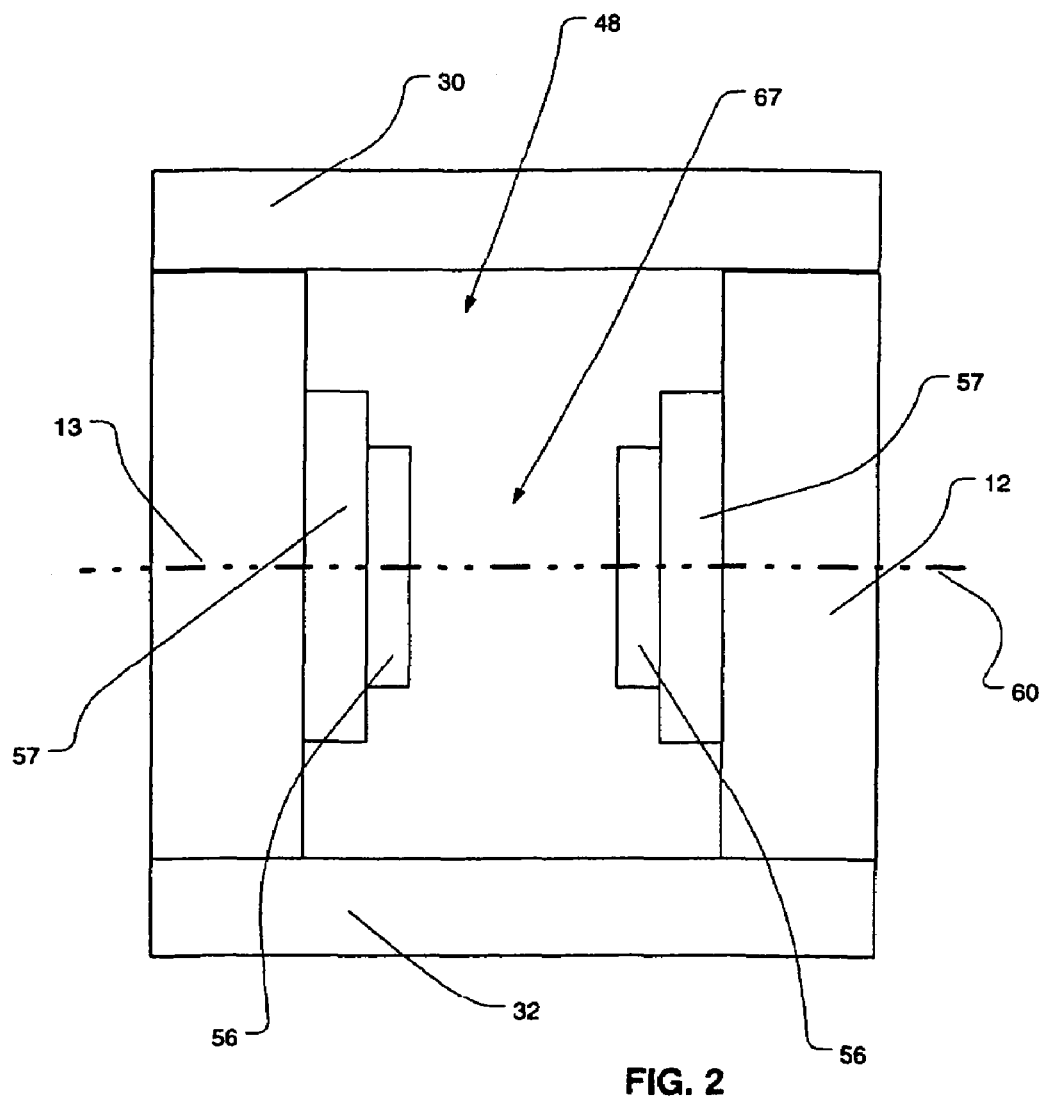
FIG. 2 is a diagrammatic end elevational view depicting part of the apparatus shown in FIG. 1.

Actuator assembly 122 is connected to a support controller 123, which in turn is connected to system controller 126. The support controller is connected to the control and feedback elements of the actuator. As further discussed below, the support controller is arranged to receive a command directing the support controller to bring the patient support to a first disposition, and to respond to such command by operating the actuator assembly 122 to drive the carriage relative to rails 117, to move patient support relative to support frame 118, and to pivot the support frame about axis 119 relative to the carriage 116, until the feedback elements of the actuator assembly indicate that the patient support is in the first disposition, and to repeat these operations in response to a further command to bring the patient support to a different selected disposition. The support controller may include conventional control elements capable of controlling fixed sequences of operations as, for example, conventional "hard-wired" electrical control apparatus, fluidic, mechanical or electromechanical control devices. Preferably, however, the support controller includes a general-purpose computer with conventional interface devices. For example, where the motion sources included in the actuator include electrical stepper motors, the support controller includes conventional stepper motor interface elements capable of providing electrical power to the stepper motors in response to commands from the processor in the computer. The interface devices in the support controller desirably also include conventional interfaces for receiving signals from the feedback devices in the actuator assembly. The support controller is depicted in FIG. 1 as a structure separate from the control and reconstruction computer 126 but operatively connected to the control and reconstruction computer. In this case, the support controller 123 and the system controller 126 desirably also includes interfaces permitting communication between these two controllers. Alternatively, the support controller 123 may be an integral part of the system controller 126. For example, the processor of the system computer may perform the logic functions of the system controller. In either case, the support controller 123 desirably also has direct connections to at least some of the input devices 103 as, for example, to a deadman's switch as mentioned above, so that the operator can manually interrupt any movement of the patient support in an emergency. Alternatively or additionally, some of the input devices 103 may be directly connected to elements of the actuator 122. For example, a deadman's switch can be arranged to interrupt power to the actuator so as to stop movement of the patient support in an emergency regardless of any action taken by the support controller 123.

In a method according to one embodiment of the invention, the patient P is disposed on patient support 120 so that the patient's back rests against the support and the patient's feet rest on footrest 124. To facilitate loading, the support controller 123 may command the actuator to move the patient support to a pre-selected loading position (not shown) in which the patient support is generally vertical with footrest 124 near the level of the surrounding floor and rails 117, so that the patient can readily walk across the floor and step onto the footrest. This provides an easy and non-threatening loading procedure for ambulatory patients. Preferably, in the loading position the patient support is tilted back so that the plane of the support is at an angle of about 5–10 degrees from vertical. Thus, when the patient is positioned on the support, gravity will tend to hold the patient's back against the support. Alternatively, if the patient is debilitated, the support controller may command the actuator to move the patient support to a substantially horizontal position, so that the patient can be transferred readily onto the support from a bed or stretcher. In the loading position, the carriage optionally may be disposed so as to position the patient support outside of the magnet. The patient may be secured to support 118 by straps (not shown) or other mechanical holding devices. In certain cases, as where support 118 in its most nearly vertical position is tilted slightly towards a reclining position, as depicted in FIG. 1, gravity will help hold the patient on the support throughout the procedure and hence straps or other holding devices may not be required. Also, as disclosed in greater detail in the commonly assigned U.S. patent application Ser. No. 10/126,015, filed Apr. 18, 2002 and entitled TRANSPOLAR FIXTURE, naming Charles A. Green et al. as inventors, the disclosure of which is hereby incorporated by reference herein, a patient rest may be engaged between poles 56 so that a patient positioned on the support can grasp the patient rest. For example, such a patient rest may be an expansible structure having grips adapted to frictionally engage the pole faces, and may include a mechanism adapted to forcibly move the grips away from one another so as to provide firm frictional engagement with the pole faces.

When the patient is loaded on the support, the operator enters a command through input-output devices 103 to commence preprogrammed operations. Support controller 123 commands the actuator 122 to bring the patient support 120 to a first disposition as illustrated in FIG. 1. The elevator frame 118, patient support 120 and patient P are tilted to a substantially vertical orientation, desirably with the plane of the support leaning back by about 5–10 degrees as shown in FIG. 1, and then the patient support 120 is lowered to the position depicted in FIG. 1. In this position, the patient P is in a substantially erect orientation, with the long or head-to-toe axis 130 of the patient extending substantially vertical as, for example, within 15 degrees of vertical, more desirably within 10 degrees of vertical and most preferably within 5 degrees of vertical. Also, in this position a region R of the patient, indicated by a broken line circle in FIG. 1 is disposed in alignment with the polar axis 60 within the patient-receiving space 67, so that this region can be imaged. In the position indicated, the region R to be imaged includes the heart and coronary arteries.

While the patient P is positioned as shown in FIG. 1, the apparatus is actuated to obtain a magnetic resonance image of structures within region R. In the MRI imaging procedure, magnetic field gradients within space 67 are applied by the gradient coils along three orthogonal axes, referred to as the "slice select," "read out" and "phase encode" directions. The gradients along the different axes vary with time in a pre-selected manner. One or more RF excitation pulses are applied by the RF transmitter. The cycle of operations required to elicit a single set of RF signals from the patient is commonly referred to as a "pulse sequence."

Figure 3:
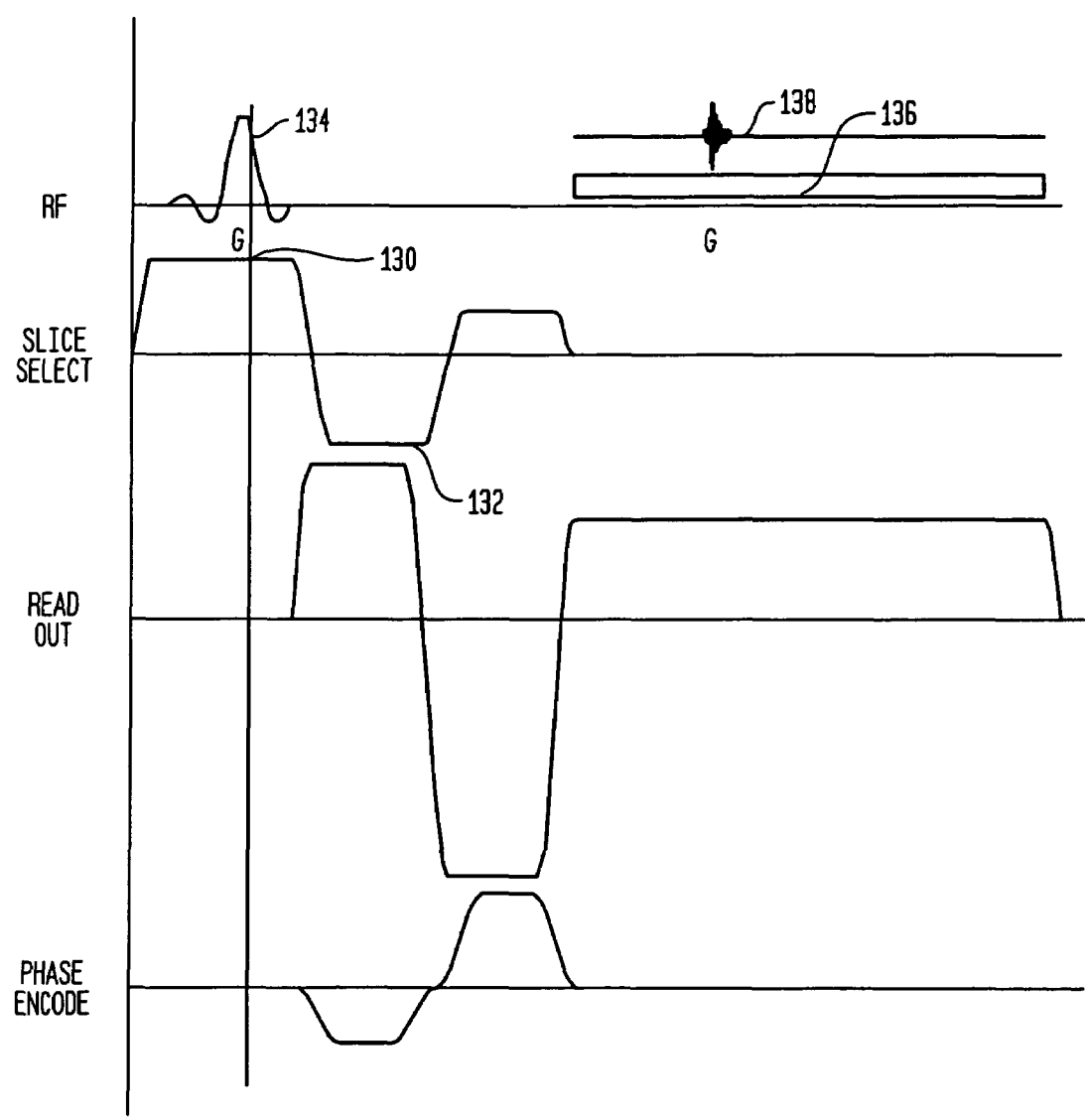
FIG. 3 is a diagrammatic MRI pulse sequence diagram used in the method of FIG. 1.

One pulse sequence is shown in FIG. 3. The gradients along the three axes are separately plotted against time in FIG. 3. In each plot, distance above or below the horizontal axis of the plot represents the magnitude of the gradient. The sign of the gradient is shown by whether the plot lies above or below the axis. For example, the magnetic field gradient along the slice select axis within the patient-receiving space is in a first, positive direction during the interval represented by plot segment 130. During a later interval represented by segment 132, the gradient along the slice select axis is in the opposite, negative direction.

During application of the slice select gradient, a pulse of RF energy is applied as indicated schematically at 134. The RF energy excites nuclei within a slice of tissue transverse to the slice select axis. The receiver in unit 109 is operated to receive magnetic resonance signals from the tissue during a so-called receive window or interval indicated schematically by an elongated bar 136 in FIG. 3. Under the influence of the various gradients, the nuclei within the selected slice of tissue emit RF signals schematically indicated at 138 in FIG. 3. These signals are "spatially encoded." That is, signals from different volume elements or "voxels" at different locations within the selected slice have different phases and frequencies. In the conventional manner, the cycle of operations or pulse sequence shown in FIG. 3 is repeated many times using different gradient patterns as, for example, different phase encoding gradient magnitudes in different repetitions. The field gradients define the frame of reference of the spatial encoding and hence define a first physical frame of reference $F_1$ for the data obtained during the process. In the example shown in FIG. 1, the slice selection gradient direction SS is directed substantially perpendicular to the plane of the patient support 118 and hence substantially perpendicular to a coronal plane of the patient's body, whereas the phase encoding gradient direction PE is perpendicular to the slice selection gradient direction and parallel to the coronal plane. The frequency encoding gradient direction FE, is perpendicular to the slice select axis SS and to the phase encoding axis PE, and is parallel to the coronal plane of the patient; the frequency encoding direction extends into and out of the plane of the drawing in FIG. 1.

The magnetic resonance signals 138 received during the various repetitions of the cycle are digitized and stored in a memory (not shown) incorporated in the control and reconstruction computer of the apparatus. Using conventional techniques, these digitized signals are processed mathematically so as to recover information from the signals for individual voxels within the selected slice. The information recovered thus provides an array of data elements, each such data element having coordinates along the SS, PE and FE axes of the first frame of reference F1 defining the location of the voxel in that frame of reference and also having data defining one or more parameters related to the chemical composition and physical state of the matter within the voxel. The various elements cooperatively constitute a first image data set. The data elements may be recorded in any form within a computer memory. For example, the coordinates and data may be recorded explicitly as a set of multiple numerical values for each data element. Alternatively, the data elements can be stored as an ordered array of values in memory, with the coordinates of each data element being implicit in the location of such data element in memory. In this embodiment, only the data values are stored as explicit numerical values.

Figure 4:
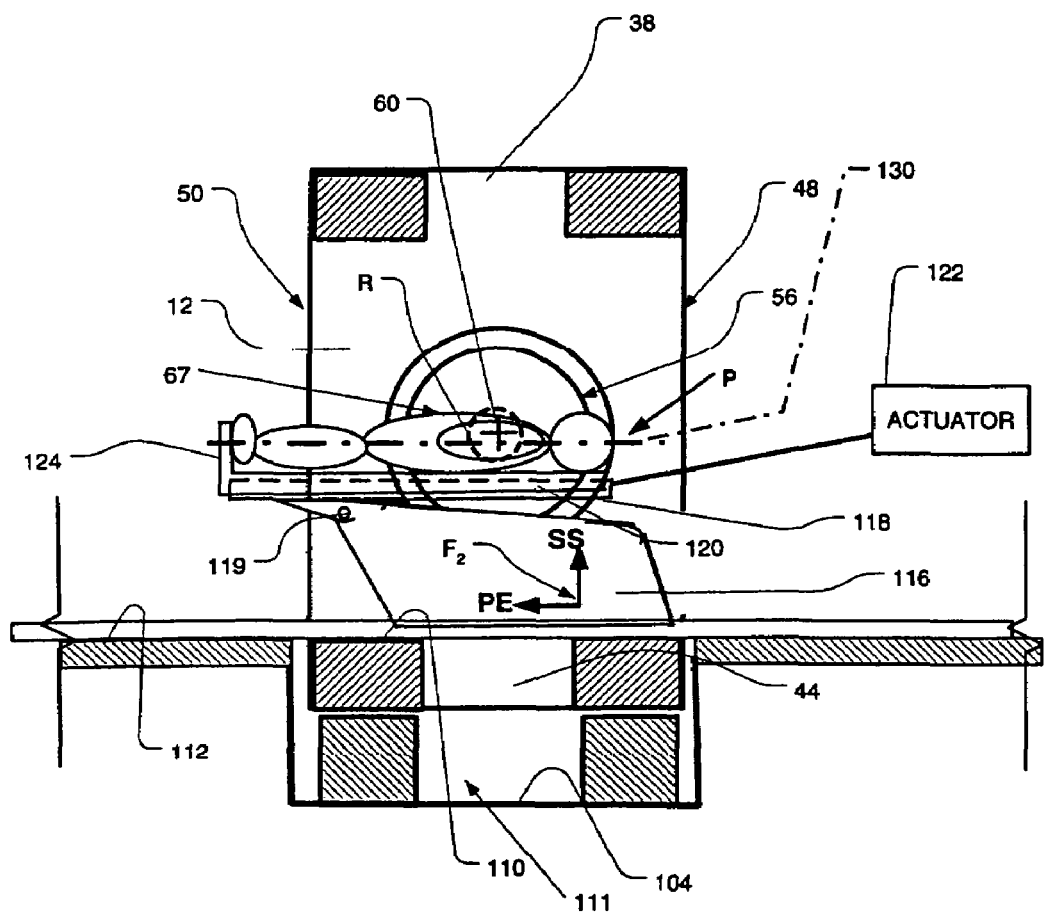
FIG. 4 is view similar to FIG. 1 but depicting portions of the apparatus during another step of the method.

Following completion of the last pulse sequence repetition used to acquire the first image data set, the system controller 126 sends a signal to the support controller 123, whereupon the support controller automatically moves the patient support to a second disposition depicted in FIG. 4. Where the system is equipped with a deadman's switch or other device which requires manual input from the operator, one or both of the controllers may actuate a buzzer, light or other signaling device to indicate that the system is ready to move the patient support, and then move the patient support to the second disposition when the operator provides the required input. However, even in this case the second disposition is preset in the memory of controller 126 or controller 123; the operator's input merely allows the system to proceed with the automatically-controlled movement.

In this second disposition, the patient support 120 extends in a substantially horizontal plane. The patient does not move relative to the patient support; the patient's back remains in position on the support, so that the patient is disposed in the supine orientation depicted in FIG. 4. In this condition, the long axis of the patient extends substantially horizontally. The support controller automatically moves the carriage 116 and patient support 120 to position the patient with the same region R is disposed within patient receiving space 67, in alignment with the polar axis. The MRI image data gathering operation is then repeated in the same manner to obtain a second set of image data in a second frame of reference $F_2$ using the same techniques as employed for gathering the first set of image data. Preferably, the gradient directions used in this step are selected so that the relationships between the gradient directions and the patient's body are the same as those used in the first imaging step. Thus, the second frame of reference also has the slice select or SS direction perpendicular to the plane of the patient support and hence perpendicular to a coronal plane of the patient, and has the PE or phase encoding direction generally parallel to the long axis of the patient. Stated another way, the system automatically rotates the gradient directions relative to the static field magnet, and relative to the gravitational direction, through the same angle as the patient support, as part of the preprogrammed sequence of operations. Because the relationship between gradient directions and directions of the patient's anatomy is maintained constant, the second image data set will have substantially the same properties as the first image data set. For example, the resolution of the two data sets in any direction relative to the patient will be the same.

After acquisition of the second image data set, the system desirably returns the patient support to the loading position, and the patient moves out of the system.

This two sets of image data may be displayed as separate visually-perceptible images. The physician may visually compare the images obtained with the patient in erect and horizontal orientations to detect differences between those images and changes in the structure of the patient's body resulting from the change in orientation.

Figure 5:
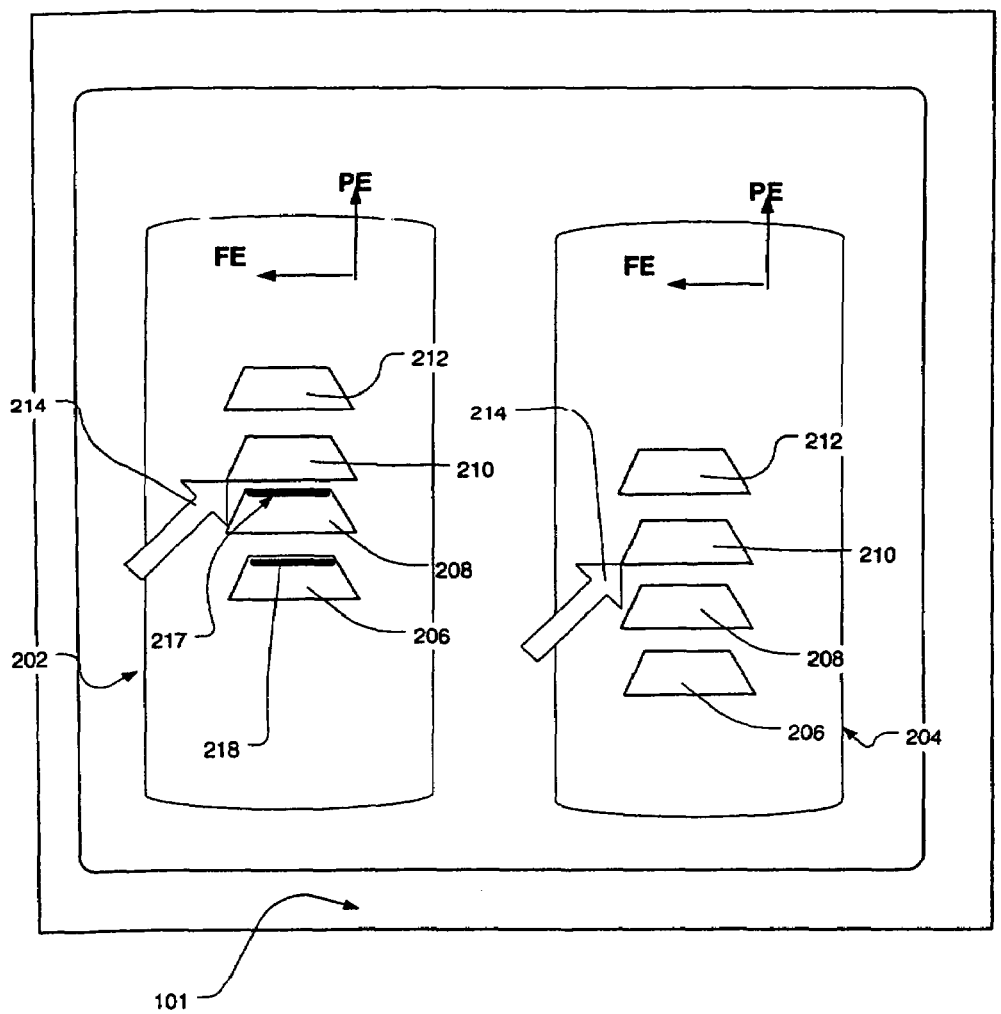
FIG. 5 is a simplified, diagrammatic view of an image display during one portion of the method illustrated in FIGS. 1–4.

Most preferably, the two sets of image data may be compared automatically by the computer. To perform such a comparison, the two sets of image data are registered in a common frame of reference representing the frame of reference of the patient's body. As discussed above, the frames of reference of the two image data sets as acquired already have the same orientation relative to the patient's body. In one registration procedure, the physician commands the system controller 126 to display on monitor 101 a visually-perceptible first image 202 (FIG. 5) reconstructed from a given slice (specified SS coordinate) in the first image data set and also instructs the controller to display a visually perceptible second image 204 reconstructed from the corresponding slice in the second image. In the example illustrated, both images show coronal sections through the spine; a few vertebrae 206–212 are schematically depicted in each image. If the physician is not satisfied that both images show the same anatomical structures, and hence that both images represent sections through the patient at the same coronal plane, he can instruct the computer to select a new SS coordinate for one or both images until he is satisfied that both images represent the same plane in the patient's anatomy. When he is satisfied, he signals the computer to accept the specified SS coordinates. At this point, the computer records the difference between the specified SS coordinates as the SS-direction offset between the coordinate systems. Next, the physician selects a common point on both images, as by moving a cursor 214 over the desired point in the first image 202 and actuating an input to indicate that the cursor is properly positioned. In the conventional manner, the computer tracks the location within the first image of the cursor as PE and FE coordinates in the frame of reference of the first image data set. When the physician actuates the input, the computer captures these coordinates as the PE and FE coordinates of the selected point in the first frame of reference. When the physician positions the cursor over the same feature in the second image and actuates the input, the computer captures the PE and FE coordinates of the same point in the second image frame of reference. Thus, the computer calculates the differences between the PE coordinates in the two frames of reference and the differences between the FE coordinates in the two frames of reference, to obtain PE and FE offsets between these frames of reference. The system can then register the two image data sets by adding the PE offset to the PE coordinate of each data point in the second data set and similarly adding the FE and SS offsets to these coordinates for each data point. More complex registration systems can be used. For example, the system can display sagital images in the SS-PE plane of each frame of reference in addition to the coronal images 202 and 204, and a similar cursor-positioning scheme can be used to capture the locations of three points on the same vertebra or other anatomical structure in all three dimensions in both frames of reference. From these locations, the system can calculate a combination of offsets along each axis and rotations about the axes required for registration, and can apply these to the data elements of one image data set using conventional image manipulation techniques to provide new coordinates for such data elements. In still further variations of the procedure, the registration step can be performed automatically, using known pattern-matching algorithms to find an anatomical structure in one image data set matching a structure designated by the physician in the other image data set using the cursor or other input device.

In the manual and automatic registration procedures discussed herein, fiducial markers can be used in place of anatomical features. Thus, fiducial markers can be physically attached to the patient's body prior to the procedure. The fiducial markers preferably are formed from a material which will provide contrast when seen against the background of the surrounding tissue in an MRI image. For example, the fiducial markers may be hollow objects filled with oil or other material having different magnetic resonance properties than the surrounding tissue, such as different spin-spin or spin-lattice relaxation time. Alternatively, the fiducial markers may be formed from a solid polymer or metal. The image data sets acquired during the procedure will include data representing the fiducial markers, and the displayed images will include depictions of the markers. In the cursor-based registration procedure discussed above, the physician may align the cursor with depictions of the fiducial markers, rather than with depictions of the anatomical structure. In an automated pattern-matching scheme, the pattern-matching algorithm may be arranged to search for data representing the known shape of the fiducial marker. Also, if the fiducial markers have magnetic resonance properties differing from those occurring in other substances present in the imaging volume, the system may search through the image data set for data elements having those properties to locate the fiducial markers without use of pattern recognition.

Once the image data sets have been brought into registration with one another, the data in each data element of the second image data set is compared with the data in the data element of the first image data set having the same coordinates. In a simple, single-element comparison scheme, the value specified by the data in each element of the second image data set may be subtracted from the value specified by the data in the corresponding element of the first image data set, or vice-versa. Other forms of comparison between such values may be used. For example, the value specified by the data in each element of the second image data set can be divided by the value specified by the data in the corresponding elements of the first image data set. Alternatively, the values specified by the data in the corresponding elements of the first and second data sets can be compared with one another so as to determine whether or not they are equal to one another within a preselected limit, and to provide a first result if they are equal and a second result if they are not. The result of the comparison is a comparison image data set representing the differences between the two images. In the subtraction scheme, the comparison image data set would have zero data at all locations if anatomical structures of the patient do not move relative to one another as the patient is reoriented. In this scheme, non-zero values in elements of the comparison image data set indicate that a structure of the patient has moved or deformed under the influence of gravity during reorientation of the patient. In the thresholding scheme, each element of the comparison data set would contain either the first result or the second result. Elements having the second result would indicate movement or deformation.

In a variant of this approach, the elements of each data set may be combined into groups of plural data elements. For example, a plurality of first data elements having data representing magnetic resonance properties in a plurality of contiguous volume elements may be treated as a group. In effect, such a group forms a single, larger data element representing a single larger volume element. Alternatively, a plurality of first data elements representing a plurality of non-contiguous volume elements in a preselected spatial relationship to one another may be treated as a group. For example, a group of data elements representing volume elements disposed at a given radius from a central point, such as on a circle or sphere surrounding the central point, may be treated as a group. In a further variant, a the group may also include the data element representing the volume element at the central point. The elements of any such group have data representing magnetic resonance characteristics in the neighborhood of a particular location. The data in the data elements of a plural-element group can be combined in various ways to provide one or more composite properties for the group. For example, the values represented by the data in the various elements can be summed or averaged. Also, a measure of the diversity among values represented by the various elements in the group as, for example, the standard deviation or range of such values, can be calculated. The elements of the second image data set can be combined into groups in the same manner, and a composite property can be calculated for each such group. The composite properties of each group of first data elements can be compared with the composite properties of the corresponding group of second data elements, representing the same location, in the same ways as the data in individual first data elements can be compared to the data in individual second data elements. Here again, the result is a comparison image data set, with a plurality of individual comparison data elements each having a value which represents the degree or existence of differences between data for the same location.

To minimize spurious data in the difference set, the comparison image data set can be subjected to an image processing procedure commonly referred to as "erosion" which removes non-zero data for particular voxels unless a certain number of neighboring voxels also have non-zero data.

The comparison image data set may be displayed as one or more separate visual images. Alternatively or additionally, the difference set may be used to select regions within one or both image data sets corresponding to locations where differences exist as, for example, where the comparison image data set has non-zero data or, more preferably, data which is of a magnitude greater than a specified threshold. The frame of reference of the comparison image data set is the same as the frame of reference of the first and second image data sets which have been registered with one another. Thus, a visually-perceptible image may be formed from either the first or second image data set and displayed. Those pixels corresponding to voxels where the comparison image data set has values above the specified threshold are highlighted in the display, as by displaying these pixels in a contrasting color, different intensity, flashing or other visually-perceptible indication. For example, the image 202 from the first data set obtained with the patient in erect orientation may be displayed and pixels of the image representing voxels where changes have occurred between the two sets of image data may be shown darkened as seen at 217 in FIG. 5. This region of the image represents displacement of vertebra 208 relative to vertebra 210. Such displacement represents a meaningful anatomical change resulting from reorientation of the patient relative to gravity. The visible highlighting aids the physician in spotting subtle changes. However, the highlighting procedure may also introduce artifacts into the displayed image. In the example depicted in FIG. 5, vertebra 206 moves along with vertebra 208; the space between these two vertebrae is unaltered by reorientation, and there is no anatomical change in the vicinity of vertebra 206. Yet, vertebra 206 in first image 202 is displaced between the two images, so that highlighting 218 appears. To avoid this effect, the computer may suppress highlighting in regions of the displayed image more than a selected distance from the structures used in the registration step as, in this example, more than a specified distance from vertebra 210. The physician may designate a new anatomical structure such as vertebra 206 for registration using the same cursor-based input procedures discussed above, and the computer will re-register the images in the same manner as discussed above to provide a new comparison image, which can be used to highlight a displayed image in the same manner. The new comparison image will show anatomical changes in the vicinity of the newly-designated structure. This procedure may be repeated numerous times using the same first and second image data sets, using different structures for registration in each repetition.

In a variant of the method discussed above, the control systems are programmed to bring the patient to more than two dispositions in sequence, and to obtain image sets at each such disposition. Whether two or more dispositions are employed, the use of pre-programmed dispositions makes the procedure repeatable; once a physician selects a positional sequence useful in a certain clinical setting, the same procedure can be re-used reliably with different patients or with the same patient at different times. Moreover, preprogramming the position sequence limits the possibilities for operator error.

A method according to a further aspect of the invention uses a generally planar patient support 120' (FIGS. 6 and 7) which is mounted on a support frame (not shown) and carriage (not shown) similar to those discussed above, which is associated with a static field magnet as described above having a pair of opposed poles 56' defining a polar axis 60'. The patient is positioned on the support so that the anterior-to-posterior axis AP of the patient's body extends generally parallel to the polar axis 60' of the magnet. Thus, a side of the patient's body faces the support 120. The support may be provided with auxiliary structures such as a pillow 160 for holding the patient on the support in this position. Also, the support may have a back rest 162 projecting from the plane of the support. As best seen in FIG. 7, the backrest may not extend perpendicularly from the support, but may be canted slightly so that when the support is in a horizontal disposition, gravity tends to hold the patient in position against the back rest. As also seen in FIG. 7, the anterior-to-posterior axis of the patient need not be exactly parallel to the polar axis, but may be at a small angle, desirably 15 degrees or less to the polar axis. The support also may be provided with an additional support (not shown) which engages the anterior surface of the patient's body, or with straps, clamps or other holding devices for holding the patient in position. The support is pivoted about a pivot axis 119' substantially parallel to polar axis 60' and substantially parallel to the anterior-posterior axis AP, to bring the patient to a different disposition. Thus, the longitudinal axis 130' of the patient desirably is substantially horizontal in the position of the support shown in solid lines in FIG. 6 and substantially vertical, as indicated at 130", in another position of the support. As in the embodiments discussed above, the apparatus may move the patient support relative to the support frame, and hence relative to the pivot axis, when the support frame is pivoted to a new disposition, so as to keep the same region of the patient aligned with the polar axis of the magnet. In other respects, the method may be as described above. Also, the concept of pivoting the patient about an axis parallel to the anterior-posterior axis may be used apart from the automatic position sequencing and comparison features discussed above. As set forth in copending, commonly assigned U.S. patent application Ser. No. 10/304,582, filed Nov. 26, 2002, the disclosure of which is hereby incorporated by reference herein, a patient can be positioned in a standing or other substantially erect position, with his or her anterior-to-posterior axis parallel to the polar axis of the magnet and may also bend laterally as, for example, by bending his or her torso sideways. These techniques can be combined with the other techniques disclosed herein. For example, a patient having or suspected of having a disease of the spine can be imaged using the pivoting steps discussed above, and can also be imaged while in an position with his or her torso bent sideways. In all of the imaging steps, the patient remains with his or her anterior-to-posterior axis parallel to the polar axis of the magnet. The patient need not be removed from the magnet during this sequence of steps. The data acquired in the combined method will show the physician the effects of gravity as well as the effects of bending.

Figure 8:
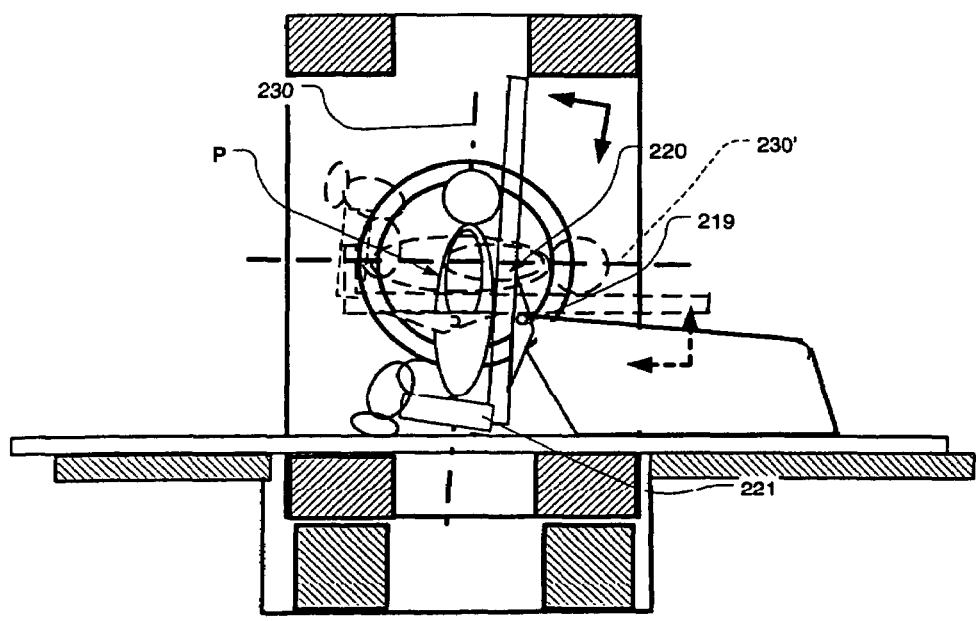
FIG. 8 is a view similar to FIG. 1 but depicting apparatus in accordance with a further embodiment of the invention.

The methods discussed herein can be practiced with the patient in still other positions. For example, as best seen in FIG. 8, the patient support 220 may be provided with a seat 221 so that the patient P may be supported in a seated posture as depicted in solid lines. In this posture, the long axis 230 of the patient's torso is substantially vertical. The support 220 may serve as a backrest. As in the embodiment discussed above with reference to FIG. 1, the patient support 220 can be rotated about an axis 219, which extends generally parallel to the polar axis of the magnet and can also move translationally relative to the magnet. Thus, the patient can be moved to the position depicted in broken lines in FIG. 8, in which the long axis 230' of the patient's torso is substantially horizontal. As in the embodiments discussed above, translational movement of the patient support can be used to place the same region of the patient in alignment with the polar axis of the magnet.

The arrangement of gradient coils 106 shown in block diagram form in FIG. 1 is further schematically depicted in FIG. 9. The gradient coils 106 include a first pair of gradient coils 302*a* and 302*b* arranged to provide a field gradient along the polar axis or field axis 60 of the magnet, also denoted as "Y" in FIG. 9. The gradient coils also include a second set of gradient coils 304*a* and 304*b* arranged to provide a field gradient along a further axis Z orthogonal to the Y axis and a third set 306*a* and 306*b* arranged to provide a field gradient along a third axis X perpendicular to the Y and Z axes. The depiction of gradient coils 302–306 are only schematic and are not intended as representing the actual shapes of the gradient coils. As is well known in the art, the actual shapes of the gradient coils are selected so that the field directions of all of coils are coincident with the field direction of the static field magnet 10. The magnitude of the field gradient along any axis applied by any set of gradient coils is directly proportional to the current passing through that set of coils. For example, the magnitude of a gradient component along the Y axis is directly proportional to the current in coils 302*a* and 302*b*, and so on. The gradient coils are all mounted in fixed position relative to the static field magnet. Thus, the X, Y and Z axes define a Cartesian coordinate system having a fixed spatial relation to the magnet frame.

The gradient coil driver 107 schematically shown in FIG. 1 includes a first amplification unit 312 (FIG. 9) having an input connected to a first digital to analog converter or "DAC" 313 and having its output connected to the first set of gradient coils 302. Similarly, a second amplification unit 314 driven by second DAC 315 is connected to the second set of gradient coils 304, whereas a third amplification unit 316 and DAC 317 are connected to the third set of gradient coils 306. DACs 313, 315 and 317 are connected to the control and reconstruction computer 126 (FIG. 1). By applying appropriate digital signals to DAC 313 the control computer can actuate gradient coils 302 to apply a component of a field gradient along the Y axis. Similarly, by applying signals to DACs 315 and 317, the control computer can actuate gradient coils 304 and 306 to apply gradient components along the Z and X axes. By applying combinations of signals to the various DACs, the computer can command the gradient coils to supply components along all of these axes. The resulting field gradient is the vector sum of all of these components. This resultant can lie at any arbitrary direction. Conversely, a gradient in any arbitrary direction can be resolved into components along the X, Y and Z axes and can be generated by applying appropriate signals to produce these components.

The orientation of the gradients used in a particular repetition of an MRI pulse sequence and, hence, the orientation of a slice from which the data is acquired in such repetition can be specified by assuming a reference orientation and specifying the directions of the readout, phase encoding and slice select axes used in such repetition by a set of rotation angles defining the transformation between the reference orientation and the actual orientation utilized. Merely by way of example, in the system shown in FIG. 10, the reference orientation has the slice select gradient direction along the Z axis, the phase encoding gradient along the Y axis, and the readout gradient along the X axis. The transformation between the reference orientation and an arbitrary orientation of the gradient axes RO, SS and PE, seen in broken lines in FIG. 10, is defined by specifying three sequential rotations: a first rotation through an angle theta about the Y axis, followed by a rotation about the readout axis through an angle phi, followed by a rotation about the slice select axis through an angle psi. In each of these rotations, the entire frame of reference of the readout, phase encoding and slice select axes rotates as a unit. These three rotations fully specify the orientation of the gradient frame of reference relative to the magnet and also specify the orientation of a slice SL relative to the magnet.

Given the rotation angles between the reference position and the arbitrary position used for a particular slice, gradients along the RO, SS and PE axes can be resolved into components along the X, Y and Z axes. This is done by calculating coefficients C, such that:

$$\vec{i}_{SS} = C_{(SSX)}\vec{i}_x + C_{(SSY)}\vec{i}_y + C_{(SSZ)}\vec{i}_z$$

$$\vec{i}_{RO} = C_{(ROX)}\vec{i}_x + C_{(ROY)}\vec{i}_y + C_{(ROZ)}\vec{i}_z$$

$$\vec{i}_{PE} = C_{(PEX)}\vec{i}_x + C_{(PEY)}\vec{i}_y + C_{(PEZ)}\text{e,rar } i_z$$

where "i" represents a unit vector in the direction denoted by the subscript associated with i and C represents a scaling coefficient. For example, $C_{(SSX)}$ represents the scaling coefficient between a gradient to be applied along the slice select axis SS and required gradient along the X axis; $C_{(SSY)}$ represents a coefficient relating the required gradient along the slice select axis and the required gradient component along the Y axis, whereas $C_{(ROX)}$ is the coefficient relating a gradient to be applied along the readout axis RO to the required component along the X axis, and so on. Stated another way, the coefficients C represent the projections of unit vectors on the SS, RO and PE axes onto the X, Y and Z axes. These coefficients can be calculated directly from the rotations angles theta, phi and psi using straightforward geometrical considerations. The conversions are given below for convenience:

$C_{ssx}$ = -sin(Theta)*cos(Phi)

$C_{ssy}$ = sin(Phi)

$C_{ssz}$ = cos(Theta)*cos(Phi)

$C_{rox}$ = [ cos(Theta)*cos(Psi)]-[ sin(Theta)*sin(Phi)*sin(Psi)]

$C_{roy}$ = -cos(Phi)*sin(Psi)

$C_{roz}$ = [ sin(Theta)*cos(Psi)]+[ cos(Theta)*sin(Phi)*sin(Psi)]

$C_{pex}$ = [ cos(Theta)*sin(Psi)]+[ sin(Theta)*sin(Phi)*cos(Psi)]

$C_{pey}$ = cos(Phi)cos(Psi)

$C_{pez}$ = [sin(Theta)*sin(Psi)]-[cos(Theta)*sin(Phi)*cos(Psi)]

For a given slice, the rotation angles and, thus, the various coefficients C are fixed, whereas the gradients to be applied along the various axes change dynamically during a particular repetition of the pulse sequence for a particular slice. Typically, the dynamically varying gradient along each gradient axis RO, PE and SS is represented by a series of digital values. That series of values may be stated as values of the slope or change per unit time of the gradient. The control computer reads out the values within each sequence in series and multiplies each value by a scaling factor related to the desired resolution in the image. Each scaled value in turn is multiplied by the coefficients C and the results are output to the DACs 313, 315 and 317, typically through a set of buffers. For example, each value in the sequence of values representing the slice select gradient is multiplied by coefficient $C_{(SSX)}$ to provide an instantaneous X-component value for the slice select gradient waveform; by $C_{(SSY)}$ to provide an instantaneous Y-component value for the slice select waveform and by $C_{(SSZ)}$ to provide an instantaneous Z-component value for the slice select waveform. This operation is repeated so as to provide a sequence of instantaneous X, Y and Z component values for the slice select gradient signal. The read out and phase encoding waveforms are handled in the same manner, so as to provide a series of instantaneous X, Y and Z component values for each of these waveforms. Each such instantaneous value is associated with a particular time. For each instant in time, the instantaneous X-component values derived from all of the waveforms are summed to provide a summed instantaneous X-direction signal for that time. Summed instantaneous Y-direction and Z-direction signals are calculated in the same manner. The series of summed X-direction signals is passed to DAC 317, whereas the summed instantaneous Y-direction signals pass to DAC 313 and the summed instantaneous Z-direction signals pass to DAC 315. In this manner, the gradient coils are actuated to produce the required field gradients. The series of values constituting the waveform of each gradient can be specified by a file specific to that gradient, or can be calculated by the system during operation based on a mathematical model or on a "generic" series of values which are scaled during operation of the system.

The foregoing system for specifying gradient directions and actuating the gradient coils assumes that the patient is in a known orientation relative to the magnet and hence in a known orientation relative to the reference orientation of the gradient axes. In that case, specifying the orientation of the slice relative to the reference orientation of the gradient axes also serves to specify the orientation of the slice relative to the patient.

As discussed above with reference to FIG. 1, and as also seen in FIG. 11, patient support 120 pivots about a pivot axis 119 (FIG. 1) parallel to the field axis or polar axis 60. Axis 60 is coincident with the first or Y axis used to specify the first rotation of the frame of reference of the gradient axes RO, SS and PE relative to the reference orientation. Accordingly, rotation of the support about this axis, denoted as B in FIG. 11 is directly additive with the first rotation of the gradient axes relative to the reference orientation, as specified by the angle theta discussed above. Stated another way, once the dispositions of the gradient axes RO, SS and PE relative to the reference orientation have been specified to provide a given orientation of the slice relative to the patient for a first orientation of the patient support 120, the same orientation of the slice relative to the patient support and patent can be maintained at a second patient position 120' (FIG. 11) by simply adding the pivot angle B of the support between the first and second orientations to the original value of theta. This addition is performed automatically by control and reconstruction computer 126 as discussed further below. The dispositions of the gradient axes relative to the reference orientation for the first orientation of the patient support can be provided to the control and reconstruction computer as discussed below.

Preferably, the software operating in control and reconstruction of computer 126 includes a support interface program element. This program element may be a separate "thread" in a multi-threaded operating system, or may be a separate program or sub-routine called by the main program. The support interface program element communicates with support controller 123. As the support controller operates actuator 122 to move and pivot the patient support, the support controller program element continually receives a value indicating the rotational position of the patient support, i.e., a value for B. When the main software receives a command to capture a slice or a series of slices, the main software communicates with the support interface program element and receives the current value of B. That value is simply added to the value of theta associated with the slice. Communication between the main program and the support interface program element can be by any conventional mode. For example, the support interface program element can write the current value of the patient support angle B into a file, which is read by the main program when the main program is commanded to acquire a slice.

Also, the support interface program element instructs the support controller 123 to cease further movement of the support. When the main program has finished the sequence of operations necessary to capture a slice or a set of slices at a given position, it sends a further message to the support control program element and the support control program element instructs the support controller 123 that further movement is allowed. The instruction to cease and resume movement may include, for example, shutting the power to support controller 123 to prevent movement and re-supplying power to the support controller to allow further movement. As discussed above, it is desirable to pre-program the support controller, so that the support controller moves to a pre-set series of dispositions as discussed above. The support control program element may perform this function as well. However, with some patients it may be desirable for the operator to directly control movement of the patient support as, for example, by inputs entered through I/O devices 103 to the system controller 126, support controller 123 or both. The steps used to determine a transformation between the first or reference patient orientation and a second patient orientation, and to transform the first gradient orientation to a second gradient orientation for in imaging the patient in the second patient orientation can be applied where the movement of the patient is manually controlled by operator input, provided that the support controller or other elements of the system tracks the movement of the patient support and supplies information representing the disposition of the patient support as, for example, a value indicating the rotational position of the patient support, i.e., a value for the angle B.

In the embodiments discussed above, the first axis used to specify rotations of the gradient coordinate system (the Y axis) is coincident with the axis of one set of gradient coils. However, this is not essential. Provided that the axis of rotation of the patient support is parallel to an axis used to specify rotation of the gradient coordinate system relative to the magnet, rotation of the patient support can be added to rotation of the gradient coordinate system in the manner described above. Also, although the additive property of the patient support angle in the system discussed above simplifies the calculations to be performed by the computer, it is not essential. Thus, where the patient support rotates about a single axis different from those used to specify rotation of the gradient coordinate system, or about a plurality of axes, the support interface program element can monitor rotation about each axis in substantially the same manner as the single angle B is monitored in the system described above. Here again, a first orientation of the gradient axis coordinate system (e.g., PE, RO, SS) for a particular slice, in a frame of reference fixed relative to the magnet (e.g., X, Y, Z) can be recorded when the patient support is in a first orientation. When the support is moved to a second orientation, the recorded rotation angles define a geometrical transformation between the first orientation and the second orientation of the patient support. That transformation is applied to the first orientation of the gradient axis coordinate system to arrive at a second orientation of the gradient axis coordinate system in the fixed frame of reference. The gradient waveforms are resolved into components along the axes of the various gradient coil sets based on the second orientation of the gradient axis coordinate system. In this instance, the transformation typically will involve more than addition of a single rotation angle as discussed above. In a further variant, the support interface program element can record translational movement of the patient support and the control computer can apply appropriate factors in reconstructing the image data sets and/or in generating the gradients to compensate for the translational movements.

The orientation of the gradient axes relative to the reference orientation for a first orientation of the patient support can be provided by determining the orientation of the patient's body in space, in the frame of reference of the magnet, and setting the orientation of the gradient axes accordingly to provide the desired orientation of the gradient axes relative to the patient's body. The systems according to preferred embodiments of the present invention simplify the task of determining the orientation of the patient's body in space, while still allowing positioning of the patient in a wide variety of orientations. The patient support moves in a known plane of motion. In the example shown in the drawings, the patient support rotates in the X-Z plane of the magnet. The orientation of the patient support in this plane is known from the support controller 123 and the feedback elements of actuator assembly 122, the orientation of the patient's body in space can be determined by assuming or measuring the orientation of a feature of the patient's body relative to the support and combining these orientations. For example, it can be assumed that for a patient having his or her torso lying prone or supine on the support, the long axis of the patient's body is parallel to the lengthwise direction of the patient support. Given this assumption, the gradient directions can be set directly. In this example, to take an axial image of the patient (an image of a slice transverse to the long axis of the patient), the slice select gradient can be set to a direction coincident with the angle of the patient support relative to the Z axis, i.e., the gradient frame of reference can be rotated through an angle theta equal to the angle of the axis of the patient support relative to the Z axis of the magnet, leaving phi and psi equal to zero.

Figure 12:
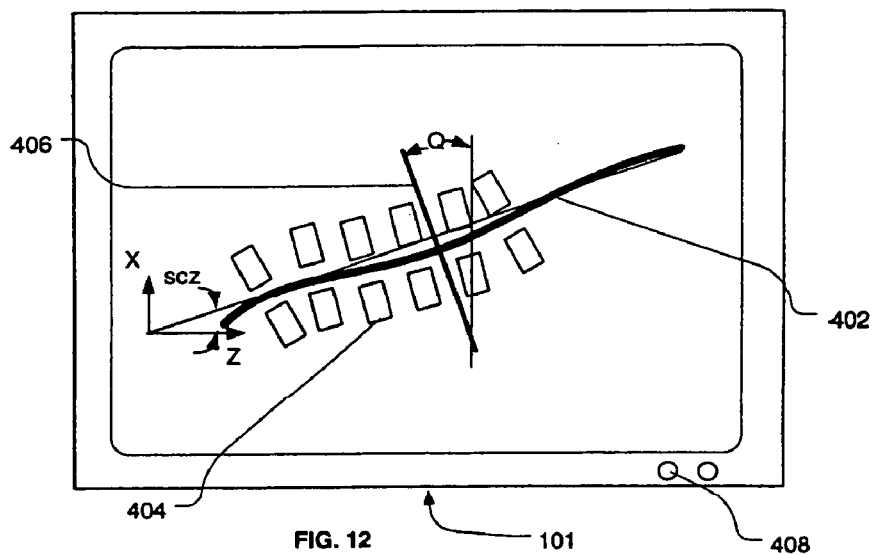
FIG. 12 is a simplified, diagrammatic view of an image display during one step of a method according to a further embodiment of the invention.

Alternatively, the orientation of the patient's body in the first orientation of the patient support can be determined by direct measurement, using the MRI imaging system or using another modality. For example, the system can acquire a "scout" image while the patient support is in a first orientation relative to the magnet, using gradients in the reference gradient orientation or in another orientation having a known relationship to the reference orientation. Most preferably, the scout image is an image in a plane substantially parallel to the plane of motion of the patient support, i.e., parallel to the X-Z plane and thus perpendicular to the field axis 60 (FIG. 9) and perpendicular to the pivot axis 119 of the patient support. The orientation of the patient's body can be determined from such a scout image. For example, as seen in FIG. 12, a scout image of a patient lying supine on patient support 120 will depict a sagital section of the body. The spinal cord 402 and vertebra 404 are shown. The angle SCZ of the spinal cord relative to the Z axis can be measured explicitly in such a scout image, and appropriate orientation of slices relative to the spinal cord can be determined from this explicitly-determined angle. Alternatively, the operator may manipulate a representation of an image plane 406 on such a scout image display, using conventional input devices as, for example, knobs 408 associated with the display, until the plane is in the desired relationship to the patient's anatomy. In the example depicted in FIG. 12, the representation of the image plane 406 is in the desired orientation when an angle Q to the X axis and perpendicular to the X-Z plane. The control computer 126 (FIG. 1) interprets these inputs as calling for rotation of a slice plane relative to the reference orientation of the gradients. Once the operator is satisfied with the orientation of the slice, he enters an appropriate signal and the computer captures this orientation as the desired orientation of the slice relative to the patient in the first orientation of the patient support. In effect, use of a scout image in this manner combines determination of the orientation of the patient's body in space with entry of data specifying the orientation of the slice relative to the body. Even where a scout image is employed, the preferred systems according to this aspect of the present invention simplify the task of determining the orientation of the patient's body. Because the patient support moves in a known plane of motion, a scout image in a plane substantially parallel to this plane of motion will always yield useful information about the orientation of the patient's body. The ability to determine the orientation of the patient in space, in combination with the ability to move the patient to a variety of patient orientations, provides a combination of versatility in image acquisition and the ability to acquire an image in the desired orientation relative to the patient. These features are usable even if the patient is imaged in only one orientation selected from the range of possible orientations.

In a variant of this approach, more than one scout image may be employed. For example, a first scout image parallel to the plane of motion may be obtained as discussed above. If this image shows the spinal cord or other desired anatomical feature in the plane of the image, it can be employed as discussed above to select other imaging planes. If not, the operator can command the system to rotate the frame of reference of the gradient directions as desired and acquire another scout image which shows the spinal cord or other anatomical feature in plane. That scout image can be used to specify the gradient directions with the patient support in a first position.

The copending, commonly assigned non-provisional U.S. patent application entitled TEMPORAL MAGNETIC RESONANCE IMAGING, filed of even date herewith, is hereby incorporated by reference herein and referred to herein as "the Temporal Application." The Temporal Application discloses, inter alia, methods of acquiring multiple magnetic resonance image data sets having slices in the same position and orientation relative to the body of the patient. In these methods, the a first imaging step is performed so as to include image slices in a first frame of reference, at known positions and orientations relative to fiducial features of the patient's anatomy such as readily identifiable bony structures or artificial fiducial markers attached to the patient. For example, the fiducial features may be included in a first scout image taken in the first frame of reference as part of the first imaging step. In a later imaging step, a second scout image is acquired which includes the includes scout image data defining a magnetic resonance image in a second frame of reference which image includes the same fiducial features. The transformation between the first and second frames of reference is deduced from the positions of the fiducial features in the first and second scout images. The positions and orientations of slices to be used in the second imaging step are deduced from the transformation and from the known positions and orientations of the slices used in the first imaging step. The same procedures can be used in the present invention.

In the foregoing discussion, the individual being examined is referred to as a "patient." This does not imply that an individual being examined must be known or suspected to have a disease or abnormality. Thus, the word "patient" as used herein includes individuals who are not known or suspected to have any disease or abnormality, as well as those who have a known or suspected disease or abnormality. According to a further embodiment of the invention, the methods discussed above are applied as a screening technique to patients having no known or suspected disease or abnormality.

As used in the present specification, the term "orientation" refers to the directions of axes of the thing referred to. Thus, as used with reference to a patient or a part of a patient, the term "orientation relative to gravity" refers to the set of angles between the axis of the gravitational field, i.e., the customary vertical direction, and the axes defined by the features of the patient's body or part of the body referred to. For example, in the condition depicted in FIG. 1, the longitudinal axis of the patient's body 130 is close to parallel with the gravitational vertical direction, whereas in the condition illustrated in FIG. 4, the same axis 130 of the patient's body is at a large angle to the gravitational vertical direction. Also, the term "patient orientation relative to one or more sets of gradient coils" refers to the angles between axes of the patient's body and axes of the coils.

As mentioned above, use of the comparison image data set in a visual display, either by display of the comparison image data set itself or by using the comparison image data set to highlight a visually-perceptible image generated from another data set allows use of the comparative data without reliance on artificial intelligence or automated pattern recognition schemes. However, such schemes may be applied to the image data set. Merely by way of example, the system may find the dimensions of any region of contiguous voxels in the comparison image data set having non-zero values, or values above a selected threshold. Similarly, the comparison image data set can be processed to provide additional information. For example, the comparison image data set may be subjected to an automated feature-extraction process to find characteristics of the comparison image data set or of particular portions of the difference, features such as the ratio of dimensions can be found for each such region. These and other features can be extracted and compared with known disease patterns either in a rule-based system or by a neural network or other system capable of learning by exposure to a known learning set of comparison images.

Numerous variations and combinations of the features discussed above can be employed without departing from the present invention. For example, the magnetic resonance data can in one or more of the image data sets can be examined automatically to select data elements corresponding to one or more particular tissue types, and the highlighting step can be limited to regions of the displayed image corresponding to particular tissue types. For example, in studies of the spine, only those pixels corresponding to voxels including disc tissue may be highlighted.

The same techniques can be applied to studies using MRI contrast agents such as gadolinium-containing agents or air, so as to monitor changes in the shape of a body cavity filled with such an agent. Where a contrast agent is employed, the comparison image data set can be revised to eliminate voxels which do not contain the contrast agent, and thereby limit highlighting in the displayed image to only pixels showing the contrast agent. As described in greater detail in copending, commonly assigned U.S. patent application Ser. No. 09/721,049, filed Nov. 22, 2000, differential imaging techniques as discussed above can be applied to monitor changes in the configuration of fluid-filled anatomical structures such as the heart and blood vessels with changes in patient orientation relative to gravity. As described in the '049 application, the MRI pulse sequences used in such techniques can be selected to show the fluid within such structures in contrast to surrounding tissues.

Also, while the discussion above refers to gathering information for the voxels within a single slice of tissue, each image data set typically includes information for voxels in numerous slices, and hence each image data set includes information for voxels in a three-dimensional array of voxels.

The magnetic resonance pulse sequence may be gated to a particular time within the cardiac cycle, so that each repetition of the pulse sequence commences at the same phase of the cardiac cycle, as, for example, at a pre-selected time after end-systole or at a pre-selected time after end-diastole. The magnetic resonance pulse sequence also may be gated to the respiratory cycle, so that so that each repetition of the pulse sequence commences at the same phase of the respiratory cycle as, for example, at end-inspiration or end-expiration.

Figure 13:
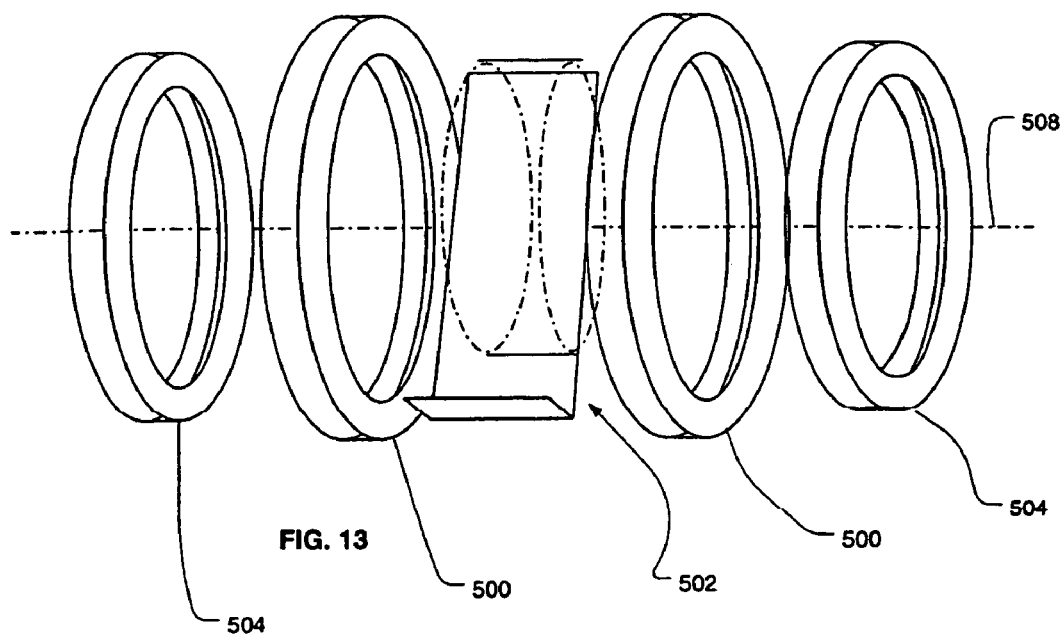
FIG. 13 is a diagrammatic view of apparatus according to yet another embodiment of the invention.

In the embodiments discussed above, the static field magnet incorporates physical poles aligned on a polar axis, and the field surrounds the polar axis. However, the invention can be applied using other types of magnets as, for example, magnets which use electromagnet coils without ferromagnetic poles to form the static magnetic field. For example, as shown in FIG. 13, certain magnets can include a set of superconducting main field coils 500 held in spaced-apart relationship to one another so as to provide a patient receiving space 502 between them. Auxiliary or "bucking" coils 504 may be provided in association with the main field coils 500. The coils are arrayed along a horizontal coil axis or field axis 508. In known manner, the numbers of turns in coils 500 and 504, the sense of the current flowing within such turns and the magnitude of such currents or selected so as to provide a substantially uniform field directed along the field axis 508 within an imaging region or inside the patient receiving space 502 and to suppress "fringe" fields outside of the patient receiving space. Such a magnet typically does not incorporate a ferromagnetic frame or physical poles. Such a magnet can provide a field of similar orientation and configuration to the magnets discussed above. The term "field axis" as used herein refers generally to an axis such that the field vector of the static magnetic field is parallel to the axis, and the field surrounds the axis. Stated another way, the field axis extends through the patient-receiving space of the magnet. In a magnet having poles, the field axis typically is coincident with the polar axis.

As these and other variations and combinations can be employed, the foregoing description of the preferred embodiments should be taken by way of illustration rather than by way of limitation of the invention as defined by the claims.

The invention claimed is:

1. A method of imaging a patient, comprising:
   (a) imaging a part of a patient by magnetic resonance while said part of the patient is oriented in a first orientation relative to gravity so as to provide a first image data set;
   (b) imaging said part of said patient by magnetic resonance while said part of the patient is oriented in a second orientation relative to gravity different from said first orientation so as to provide a second image data set; and
   (c) comparing data in said first and second image data sets so that such comparison results in a further image data set referred to as a comparison image data set.

2. A method as claimed in claim 1, further comprising displaying a visually-perceptible image constructed at least in part from said comparison image data set.

3. A method as claimed in claim 2 wherein said displaying step includes displaying a visually-perceptible image constructed from said first data set, said second data set or both, with highlighting of portions of said image at regions of said image corresponding to locations where said comparison image data set indicates that differences exist between said first and second data sets.

4. A method as claimed in claim 1 wherein said patient part includes at least a part of the torso.

5. A method as claimed in claim 1 wherein said imaging steps are performed without displacement of said patient part relative to other portions of the patient except insofar as such displacement may be caused by gravity.

6. A method as claimed in claim 1 further comprising the step of disposing the patient on a bed and moving the bed so that the bed is in a first disposition when the first data set is acquired and in a second disposition when the second data set is acquired.

7. A method as claimed in claim 1 wherein said first and second image data sets represent tissues include at least part of the spine.

8. A method as claimed in claim 7 wherein each of said first and second image data sets includes data elements, each data element having coordinates specifying a location in a frame of reference and data representing at least one characteristic of magnetic resonance signals from tissue at a location specified by such coordinates in such frame of reference.

9. A method as claimed in claim 8 further comprising the step of specifying a vertebra, said comparing step including registering said first and second data sets with one another in a common frame of reference so that first data elements representing the specified vertebra in the first image data set have the same coordinates in said common frame of reference as second data elements representing the specified vertebra in said second data set, and comparing the data in first and second data elements having the same coordinates in said common frame of reference with one another.

10. A method as claimed in claim 8 wherein said comparing step includes specifying a pair of vertebra remote from one another and registering said first and second data sets with one another so that first data elements representing the specified pair of vertebra in said first data set are at the same coordinates in said common frame of reference as second data elements representing the pair of specified vertebra in said second data set, and comparing the data in first and second data elements having the same coordinates in said common frame of reference with one another.

11. A method as claimed in claim 1 wherein each of said first and second image data sets includes data elements, each data element having coordinates specifying a location in a frame of reference and data representing at least one characteristic of magnetic resonance signals from tissue at a location specified by such coordinates in such frame of reference, the method further comprising the step of specifying a bodily structure and registering said first and second data sets with one another so that first data elements representing the specified bodily structure in said first image data set have the same coordinates in said common frame of reference as second data elements representing the specified bodily structure in said second data image set, and comparing the data in one or more groups of first and second data elements having the same coordinates in said common frame of reference with one another, whereby said comparison data set will depict displacement of other bodily structures relative to the specified bodily structure.

12. A method as claimed in claim 11 further comprising the step of repeating said step of specifying a bodily structure, said registering step and said comparing step to form additional comparison data sets.

13. A method as claimed in claim 11 further comprising the step of displaying an image in visually-perceptible form constructed at least in part from said comparison data set, said image including a representation of a region surrounding said specified bodily structure.

14. A method of magnetic resonance imaging comprising the steps of:
(a) conducting magnetic resonance imaging of a part of a patient while said part of the patient is oriented in a first orientation relative to gravity and relative to a stationary static field magnet of a magnetic resonance imaging system to so as to provide a first image data set;
(b) moving the part of the patient to a second orientation relative to gravity and relative to said static field magnet, said second orientation being different from said first orientation;
(c) imaging said part of said patient while said part of the patient is oriented in said second orientation so as to provide a second image data set; and
(d) comparing said first and second data sets.

15. A method as claimed in claim 14 wherein said step of comparing said first and second data sets includes:
(a) providing said first and second data sets in a common frame of reference; and
(b) comparing first and second data for each location in said common frame of reference.

16. A method as claimed in claim 15 wherein said first data set includes a plurality of first data elements each having data representing one or more characteristics of magnetic resonance signals from a particular location and said second data sets includes a plurality of second data elements each having data representing one or more characteristics of magnetic resonance signals from a particular location, and said step of comparing said first and second image data sets includes comparing the data in one or more groups of first data elements to the data in one or more groups of second data elements representing magnetic resonance signals from the same locations to derive a comparison image data set.

17. A method as claimed in claim 16 wherein each said group of data elements includes a plurality of data elements.

18. A method as claimed in claim 17 wherein each said group of data elements includes data elements representing one or more characteristics of magnetic resonance signals from a plurality of contiguous volume elements.

19. A method as claimed in claim 17 wherein each said group of data elements includes data elements representing one or more characteristics of magnetic resonance signals from a plurality of noncontiguous volume elements.

20. A method as claimed in claim 17 wherein each said group of data elements includes data elements representing one or more characteristics of magnetic resonance signals from a plurality of volume elements located at the same distance from a center point associated with such group of data elements.

21. A method as claimed in claim 17 wherein said step of comparing said groups of data elements includes deriving a composite property of each said group of first data elements from the data in all elements of that group, from the data in all elements of the group, deriving a composite property of each said group of second data elements from the data in all elements of that group, and comparing the composite property of each group of first data elements with the composite property of the corresponding group of second data elements representing the same locations.

22. A method as claimed in claim 16 wherein each said group of data elements consists of a single data element.

23. A method as claimed in claim 16, further comprising displaying in a visually-perceptible image based at least in part on said comparison image data set.

24. A method as claimed in claim 14 wherein said step of generating a comparison data set between said first and second data sets includes automatically comparing the geometrical relationship between two bodily structures in said first data set with the relationship between the same two bodily structures in said second data set.

25. A method as claimed in claim 24 wherein said two bodily structures are bones.

26. A method as claimed in claim 25 wherein said two bodily structures are mutually-adjacent vertebrae.

27. A method of magnetic resonance imaging comprising the steps of:

(a) providing a static field magnet defining a horizontal field axis;
(b) disposing a patient in a first disposition so that an anterior-to-posterior axis of the patient is substantially horizontal and parallel to said field axis and so that a longitudinal axis of the patient points in a first direction;
(c) obtaining a first magnetic resonance data set while the patient is in said first disposition;
(d) rotating the patient about a pivot axis parallel to said field axis and parallel to said anterior-to-posterior axis to a second disposition in which said longitudinal axis of said patient points in a second direction different from said first direction; and
(e) while the patient is in said second disposition, obtaining a second magnetic resonance data set.

28. A method as claimed in claim 27 wherein said step of disposing the patient in said first disposition includes placing the patient on an elongated support so that a side of the patient confronts said support and said rotating step includes pivoting said support about said pivot axis.

29. A method as claimed in claim 28 wherein the longitudinal axis of the patient extends generally vertically in one of said dispositions and extends generally horizontally in the other one of said dispositions.

30. Magnetic resonance imaging apparatus comprising:
(a) a static field magnet defining a patient-receiving space;
(b) a patient support adapted to hold a patient's body, said patient support being movable over a range of dispositions which includes a range of rotational positions about at least one pivot axis so that within at least some dispositions within said range of dispositions, at least parts of a patient's body supported on the patient support is disposed within said patient-receiving space, said patient support being adapted to constrain at least the parts of the patient's body positioned within the patient-receiving space against movement relative to one another;
(c) a drive mechanism mechanically linked to said patient support, said drive mechanism being operative to move said patient support within said range of dispositions; and
(d) a support controller connected to said drive mechanism, said support controller being operative to actuate said drive mechanism to bring said patient support to a pre-selected sequence of different rotational positions within said range of rotational positions while a patient's body is supported on said patient support so as to bring the patient's body to a plurality of different orientations relative to gravity.

31. Apparatus as claimed in claim 30 wherein said patient support includes an elongated bed.

32. Apparatus as claimed in claim 31 wherein said static field magnet includes a pair of poles spaced horizontally from one another on opposite sides of said patient-receiving space and said range of dispositions includes a range of elevational positions.

33. Apparatus as claimed in claim 31 wherein said pivot axis is substantially horizontal and said range of dispositions further includes a range of positions along an axis of movement transverse to said pivot axis.

34. Apparatus as claimed in claim 30 further comprising a set of gradient coils arranged to apply magnetic field gradients in said patient-receiving space, a transmitter adapted to apply radio frequency excitation within said patient-receiving space, a receiver adapted to receive magnetic resonance signals emitted by a patient within said patient-receiving space, and a system controller linked to said gradient coils, transmitter and receiver, said system controller being operative to actuate said gradient coils, transmitter and receiver to elicit magnetic resonance signals from a patient in said patient-receiving space, said support controller being operatively linked to said system controller so that said magnetic resonance signals are elicited while the patient support is at plural different rotational positions.

35. A method of magnetic resonance imaging comprising the steps of:
(a) automatically moving a patient through a pre-selected sequence of dispositions relative to a static field magnet so as to move the patient through a range of orientations relative to gravity without moving one part of the patient relative to another part of the patient, said moving step being performed so that in at least a plurality of different orientations relative to gravity, the patient is subjected to a static magnetic field provided by said magnet; and
(b) eliciting magnetic resonance signals from said parts of the patient in said plurality of different orientations relative to gravity.

36. A method as claimed in claim 35 further comprising constraining said one part of the patient against movement relative to said another part of the patient during said moving step.

37. A method as claimed in claim 35 wherein said automatically moving step includes the step of automatically arresting the movement temporarily in at least some of said plurality of dispositions and said step of eliciting magnetic resonance signals includes the step of automatically performing a set of pulse sequences while the patient is in each of said at least some of said plurality of dispositions.

38. A method as claimed in claim 35 wherein said automatically moving step includes moving a rigid patient support bearing said parts of the patient.

39. A method of magnetic resonance imaging comprising the steps of:
(a) specifying a first gradient orientation of one or more magnetic field gradient directions relative to one or more sets of gradient coils for a patient disposed in a first patient orientation relative to said one or more sets of gradient coils, whereby said first gradient orientation and said first patient orientation define a first slice orientation relative to the patient;
(b) moving the patient to a second patient orientation relative to said one or more sets of gradient coils, said second patient orientation being different from said first patient orientation, and automatically determining a transformation between said first and second patient orientations;
(c) transforming said first gradient orientation to a second gradient orientation of one or more magnetic field gradient directions relative to said gradient coils using said transformation between said first and second patient orientations, so that said second patient orientation and said second gradient orientation define the same slice orientation relative to the patient; and
(d) while the patient is in said second patient orientation, actuating said gradient coils to apply magnetic field gradients in said second gradient orientation and acquiring magnetic resonance signals.

40. A method as claimed in claim 39 further comprising the steps of actuating said gradient coils to apply magnetic field gradients in said first gradient orientation and acquiring magnetic resonance signals while the patient is in said first patient orientation.

41. A method as claimed in claim 40 wherein said step of specifying the first gradient orientation includes specifying one or more rotations of said gradient directions relative to a reference orientation, including a first rotation about a first axis, said step of moving the patient includes pivoting the patient about a pivot axis parallel to said first axis through a known pivot angle, and said step of transforming the first gradient orientation to said second gradient orientation includes adding the pivot angle to the specified first rotation.

42. A method as claimed in claim 40 wherein each said step of actuating said gradient coils includes providing values representing gradients to be applied in said gradient directions and multiplying said values by transformation coefficients between each said gradient direction and directions associated with each set of said gradient coils to thereby provide values of components to be applied by each set of said gradient coils.

43. A method as claimed in claim 40 wherein said step of moving the patient is performed by automatically moving a patient support bearing the patient, the method further comprising the step of automatically preventing movement of the patient support during each said step of actuating said gradient coils.

44. A method of magnetic resonance imaging comprising the steps of:
  (a) positioning a patient in a selected position within a range of patient positions by pivoting a patient support within a range of orientations in a known plane of motion;
  (b) determining the orientation of a portion of the patient's body in said selected position; and
  (c) setting a gradient orientation of one or more field gradients in space based at least in part on the determined orientation of said portion of the patient's body; and
  (d) acquiring a magnetic resonance image of the patient's body using said one or more field gradients.

45. A method as claimed in claim 44 and said step of determining the orientation of a portion of the patient's body includes acquiring one or more scout images of said portion of the patient's body in one or more planes including a principal scout image in a principal scout plane substantially parallel to said known plane of motion.

46. A method as claimed in claim 45 wherein said portion of the patient's body includes at least a part of the spine, said step of acquiring one said principal scout image including acquiring a first principal scout image in a first principal scout plane parallel to said known plane of motion, determining if said first principal scout image shows the spinal cord in the plane of said first principal scout image and, if not, acquiring one or more additional principal scout images in other planes until one such principal scout image shows the spinal cord in the plane of the image.

47. A method as claimed in claim 44 wherein said step of positioning a patient includes and monitoring the orientation of the patient support, and said step of determining the orientation of a portion of the patient's body is based at least in part on the monitored orientation of the patient support.

48. A method as claimed in claim 47 wherein the step of determining the orientation of a portion of the patient's body is based on the monitored orientation of the patient support and an assumed or measured orientation of said portion of the patient's body relative to the patient support, and is performed without reference to a scout image.

* * * * *

UNITED STATES PATENT AND TRADEMARK OFFICE
CERTIFICATE OF CORRECTION

PATENT NO. : 7,123,008 B1  
APPLICATION NO. : 10/419385  
DATED : October 17, 2006  
INVENTOR(S) : Raymond V. Damadian and Robert Wolf Page 1 of 1

It is certified that error appears in the above-identified patent and that said Letters Patent is hereby corrected as shown below:

Column 2, line 47, replace "supplying of" with --supine--;  
Column 5, line 57, replace "a body structures" with --a body structure--;  
Column 5, line 59, replace "vertebrae" with --vertebra--;  
Column 6, line 10, replace "vertebrae" with --vertebra--;  
Column 6, line 40, replace "electromagnet" with --electromagnetic--;  
Column 7, line 4, replace "then" with --than--;  
Column 7, line 28, replace "on" with --one--;  
Column 7, line 43, replace "resonant" with --resonance--;  
Column 8, line 58, replace "electromagnet" with --electromagnetic--;  
Column 9, line 3, replace ";" with --,--;  
Column 10, line 59, replace "includes" with --include--;  
Column 13, line 62, replace "This" with --These--;  
Column 14, line 12, replace "visually" with --visually- --;  
Column 16, line 2, delete "the";  
Column 19, line 65, replace "rotations" with --rotation--;  
Column 20, line 39, replace "form" with --form;--;  
Column 21, line 29, delete "of";  
Column 22, line 4, delete "in";  
Column 22, line 32, replace "(e.g., X, Y, Z)" with --(e.g., X, Y, Z,),--;  
Column 23, line 43, replace "when" with --with--;  
Column 25, line 23, delete "can";  
Column 25, line 67, replace "electromagnet" with --electromagnetic--;  
Column 26, line 10, replace "or" with--are--;  
Column 26, line 66, replace "include" with--including--;  
Column 28, line 15, replace "sets" with --set--;  
Column 29, line 33, replace "parts" with --part--;

Signed and Sealed this

Sixteenth Day of October, 2007

JON W. DUDAS  
*Director of the United States Patent and Trademark Office*

UNITED STATES PATENT AND TRADEMARK OFFICE
CERTIFICATE OF CORRECTION

PATENT NO.        : 7,123,008 B1
APPLICATION NO.   : 10/419385
DATED             : October 17, 2006
INVENTOR(S)       : Raymond V. Damadian and Robert Wolf It is certified that error appears in the above-identified patent and that said Letters Patent is hereby corrected as shown below:

Column 2, line 47, replace "supplying of" with --supine--;
Column 5, line 57, replace "a body structures" with --a body structure--;
Column 5, line 59, replace "vertebrae" with --vertebra--;
Column 6, line 10, replace "vertebrae" with --vertebra--;
Column 6, line 40, replace "electromagnet" with --electromagnetic--;
Column 7, line 4, replace "then" with --than--;
Column 7, line 28, replace "on" with --one--;
Column 7, line 43, replace "resonant" with --resonance--;
Column 8, line 58, replace "electromagnet" with --electromagnetic--;
Column 9, line 3, replace ";" with --,--;
Column 10, line 59, replace "includes" with --include--;
Column 13, line 62, replace "This" with --These--;
Column 14, line 12, replace "visually" with --visually- --;
Column 16, line 2, delete "the";
Column 19, line 48, replace " $\vec{i}_{RO} = C_{(ROX)}\vec{i}_x + C_{(ROY)}\vec{i}_y + C_{(ROZ)}\vec{i}_z$ "
with -- $\vec{i}_{RO} = C_{(ROX)}\vec{i}_x + C_{(ROY)}\vec{i}_y + C_{(ROZ)}\vec{i}_z$ --;
Column 19, line 50, replace " $\vec{i}_{PE} = C_{(PEX)}\vec{i}_x + C_{(PEY)}\vec{i}_y + C_{(PEZ)}\vec{i}_z$ "
with -- $\vec{i}_{PE} = C_{(PEX)}\vec{i}_x + C_{(PEY)}\vec{i}_y + C_{(PEZ)}\vec{i}_z$ --;
Column 19, line 65, replace "rotations" with --rotation--;
Column 20, line 39, replace "form" with --form;--;
Column 21, line 29, delete "of";
Column 22, line 4, delete "in";
Column 22, line 32, replace "(e.g., X, Y, Z)" with --(e.g., X, Y, Z,),--;
Column 23, line 43, replace "when" with --with--;
Column 25, line 23, delete "can";
Column 25, line 67, replace "electromagnet" with --electromagnetic--;
Column 26, line 10, replace "or" with --are--;
Column 26, line 66, replace "include" with --including--;
Column 28, line 15, replace "sets" with --set--;

UNITED STATES PATENT AND TRADEMARK OFFICE
CERTIFICATE OF CORRECTION

PATENT NO. : 7,123,008 B1
APPLICATION NO. : 10/419385
DATED : October 17, 2006
INVENTOR(S) : Raymond V. Damadian and Robert Wolf It is certified that error appears in the above-identified patent and that said Letters Patent is hereby corrected as shown below:

Column 29, line 33, replace "parts" with --part--;

This certificate supersedes the Certificate of Correction issued October 16, 2007.

Signed and Sealed this

Seventeenth Day of November, 2009

David J. Kappos
*Director of the United States Patent and Trademark Office*